United States Patent
Ishii et al.

(10) Patent No.: US 8,730,083 B2
(45) Date of Patent: May 20, 2014

(54) ANALOG-DIGITAL CONVERTER WITH CALIBRATION AND RECEIVER INCLUDING THE CONVERTER

(75) Inventors: Hirotomo Ishii, Kamakura (JP); Tomohiko Sugimoto, Yokohama (JP); Masanori Furuta, Odawara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/610,499

(22) Filed: Sep. 11, 2012

(65) Prior Publication Data

US 2013/0182803 A1 Jul. 18, 2013

(30) Foreign Application Priority Data

Jan. 18, 2012 (JP) ................. 2012-008229

(51) Int. Cl.
*H03M 1/12* (2006.01)

(52) U.S. Cl.
USPC ........... 341/172; 341/155; 341/136; 341/140; 375/345; 375/370; 375/376

(58) Field of Classification Search
USPC ............................ 341/110–172; 375/345–376
See application file for complete search history.

(56) References Cited

U.S. PATENT DOCUMENTS

| | | | | |
|---|---|---|---|---|
| 5,175,547 A * | 12/1992 | Lyon et al. | .................... | 341/120 |
| 5,218,362 A | 6/1993 | Mayes et al. | | |
| 5,638,072 A * | 6/1997 | Van Auken et al. | ........... | 341/141 |
| 6,400,302 B1 * | 6/2002 | Amazeen et al. | ............. | 341/172 |
| 6,686,865 B2 * | 2/2004 | Confalonieri et al. | ........ | 341/172 |
| 6,958,722 B1 * | 10/2005 | Janakiraman et al. | ........ | 341/161 |
| 7,015,841 B2 * | 3/2006 | Yoshida et al. | ............... | 341/120 |
| 7,026,975 B1 * | 4/2006 | Steward et al. | ............... | 341/161 |
| 7,432,844 B2 * | 10/2008 | Mueck et al. | ................. | 341/163 |
| 7,830,295 B2 | 11/2010 | Ikeda et al. | | |
| 7,839,319 B2 * | 11/2010 | Nittala et al. | ................. | 341/162 |
| 7,986,253 B2 * | 7/2011 | Cho et al. | ...................... | 341/118 |
| 8,059,022 B2 * | 11/2011 | Cho et al. | ...................... | 341/150 |
| 8,223,044 B2 * | 7/2012 | Snedeker | ..................... | 341/118 |

(Continued)

FOREIGN PATENT DOCUMENTS

JP 03-276921 12/1991
JP 05-167449 7/1993

(Continued)

OTHER PUBLICATIONS

K.H. Hadidi et al., "An 8-b 1.3-MHz Successive-Approximation A/D Converter", IEEE Journal of Solid-State Circuits, 1990, pp. 880-885.

(Continued)

*Primary Examiner* — Lam T Mai
(74) *Attorney, Agent, or Firm* — Knobbe, Martens, Olson & Bear LLP

(57) ABSTRACT

According to an embodiment, there are provided a capacitor DAC for generating an output signal in accordance with a connection state of a capacitor element, a reference voltage generation circuit for supplying a reference voltage to the capacitor DAC, a comparator for outputting a comparison result in accordance with the output signal, a successive approximation register for outputting a digital signal in accordance with the comparison result, and a control circuit for controlling a connection state of the capacitor element in accordance with the comparison result and comparing an ideal code with a digital signal obtained by sampling a predetermined voltage, thereby correcting an error of the digital signal.

14 Claims, 39 Drawing Sheets

(56) References Cited

U.S. PATENT DOCUMENTS

| | | | |
|---|---|---|---|
| 8,289,198 B2* | 10/2012 | Agarwal et al. | 341/172 |
| 8,310,388 B2* | 11/2012 | Chang et al. | 341/156 |
| 8,390,501 B2* | 3/2013 | Chang et al. | 341/163 |
| 8,441,386 B2* | 5/2013 | Strode | 341/162 |
| 8,487,794 B2* | 7/2013 | Huang et al. | 341/120 |

FOREIGN PATENT DOCUMENTS

| | | |
|---|---|---|
| JP | 06-104754 | 4/1994 |
| JP | 2001-024509 | 1/2001 |
| JP | 2010-016466 | 1/2010 |

OTHER PUBLICATIONS

F. Kuttner, "A 1.2V 10b 20MSample/s non-binary successive approximation ADC in 0.13um CMOS", IEEE International Solid-State Circuit Conference, 2002, pp. 176-177.

A.N. Karanicolas et al., "A 15-b 1-Msample/s Digitally Self-Calibrated Pipeline ADC", IEEE Journal of Solid-State Circuits, 1993, pp. 1207-1215.

* cited by examiner

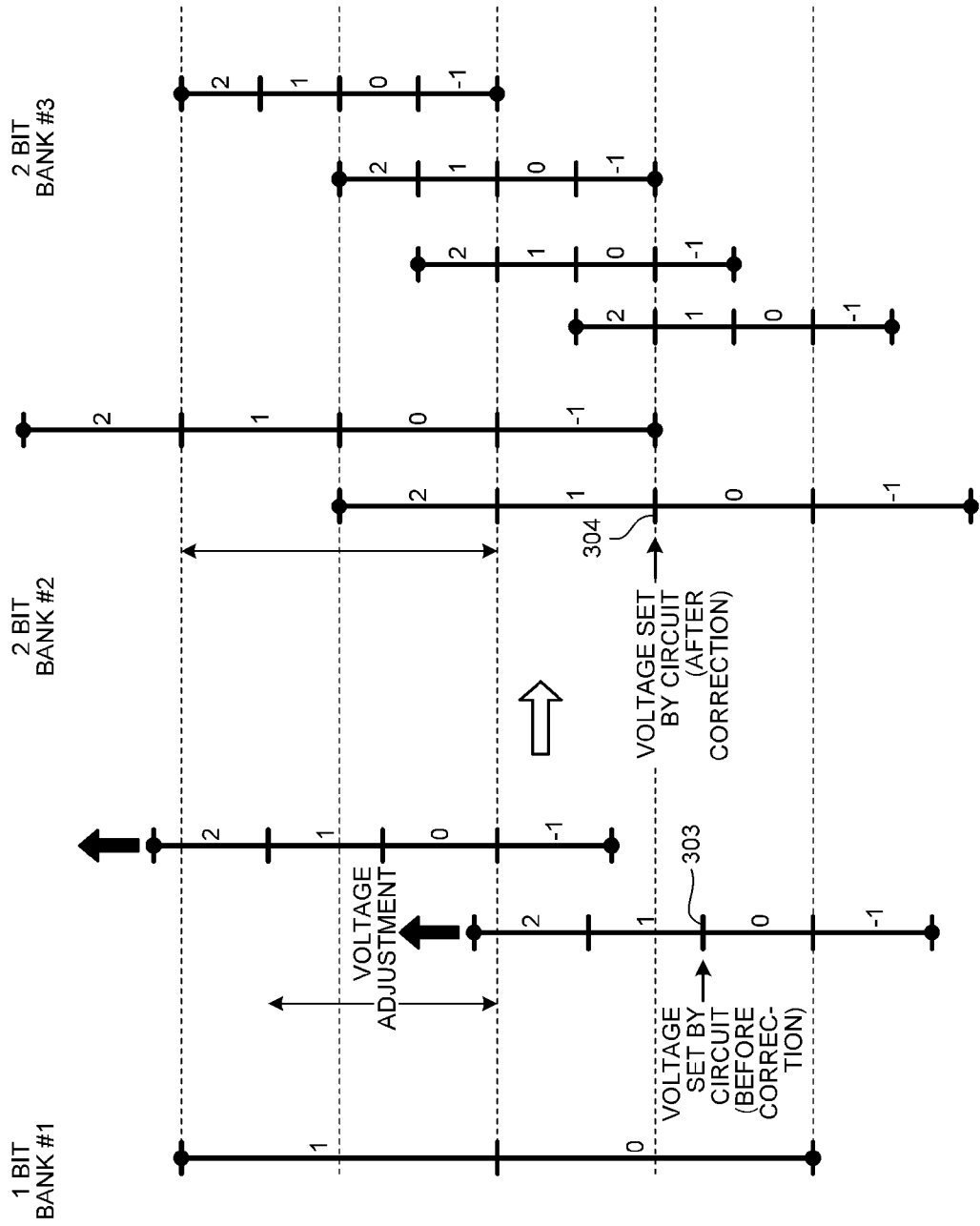

VARIABLE RESISTOR

ANALOG-DIGITAL CONVERTER WITH CALIBRATION AND RECEIVER INCLUDING THE CONVERTER

CROSS-REFERENCE TO RELATED APPLICATIONS

This application is based upon and claims the benefit of priority from the prior Japanese Patent Application No. 2012-008229, filed on Jan. 18, 2012; the entire contents of which are incorporated herein by reference.

FIELD

The present embodiment generally relates to an analog-digital converter and a receiver.

BACKGROUND

A successive approximation ADC (Analog to Digital Converter) receives an input reference voltage in a capacitor DAC (Digital to Analog Converter), compares the set voltage of the capacitor DAC and the input voltage, and controls the capacitor DAC so that the both voltages approximate to each other the most, thereby converting the input voltage into a digital code.

The capacitor DAC includes a plurality of capacitor banks (capacitor array). Based on the set voltage of each capacitor bank, a threshold value thereof is set; based on this threshold value, bit detection is performed. Therefore, when the set voltage is varied, the threshold value is also varied, which results in a problem in that this variation in threshold value causes an error in conversion result (digital code). The factors that vary the set voltage include variation in each capacitor included in the capacitor DAC, variation in reference voltage when a plurality of reference voltages is used, and the like.

BRIEF DESCRIPTION OF THE DRAWINGS

FIG. 12 schematically illustrates the correction of the reference voltage according to the second embodiment;

DETAILED DESCRIPTION

According to an embodiment, there were provided a capacitor DAC including one or more capacitor elements at least one of which is connected to an input signal and which generates an output signal in accordance with the connection state of the capacitor element; a reference voltage generation circuit for supplying a reference voltage to the capacitor DAC; a comparator for outputting a comparison result in accordance with the output signal; a successive approximation register for outputting a digital signal in accordance with the comparison result from the comparator; and a control circuit for controlling the connection state of the capacitor element in accordance with the comparison result from the comparator. The control circuit compares the conversion result, which is a digital signal obtained by sampling a predetermined voltage, with an ideal code, which is an ideal digital signal correspond to the predetermined voltage, and controls the correction for reducing the error of the digital signal in accordance with this comparison result. The capacitor element connected to the input signal is connected to the reference voltage instead of the input signal when the predetermined voltage is determined. As for the capacitor DAC, the predetermined voltage is determined based on the difference between the reference voltage connected at the sampling and the reference voltage connected at the comparison in the capacitor element among the capacitor elements of the capacitor DAC, that remains connected to the same destination during the comparison and has difference in reference voltage connected at the sampling and at the comparison.

FIRST EMBODIMENT

Figure 1:
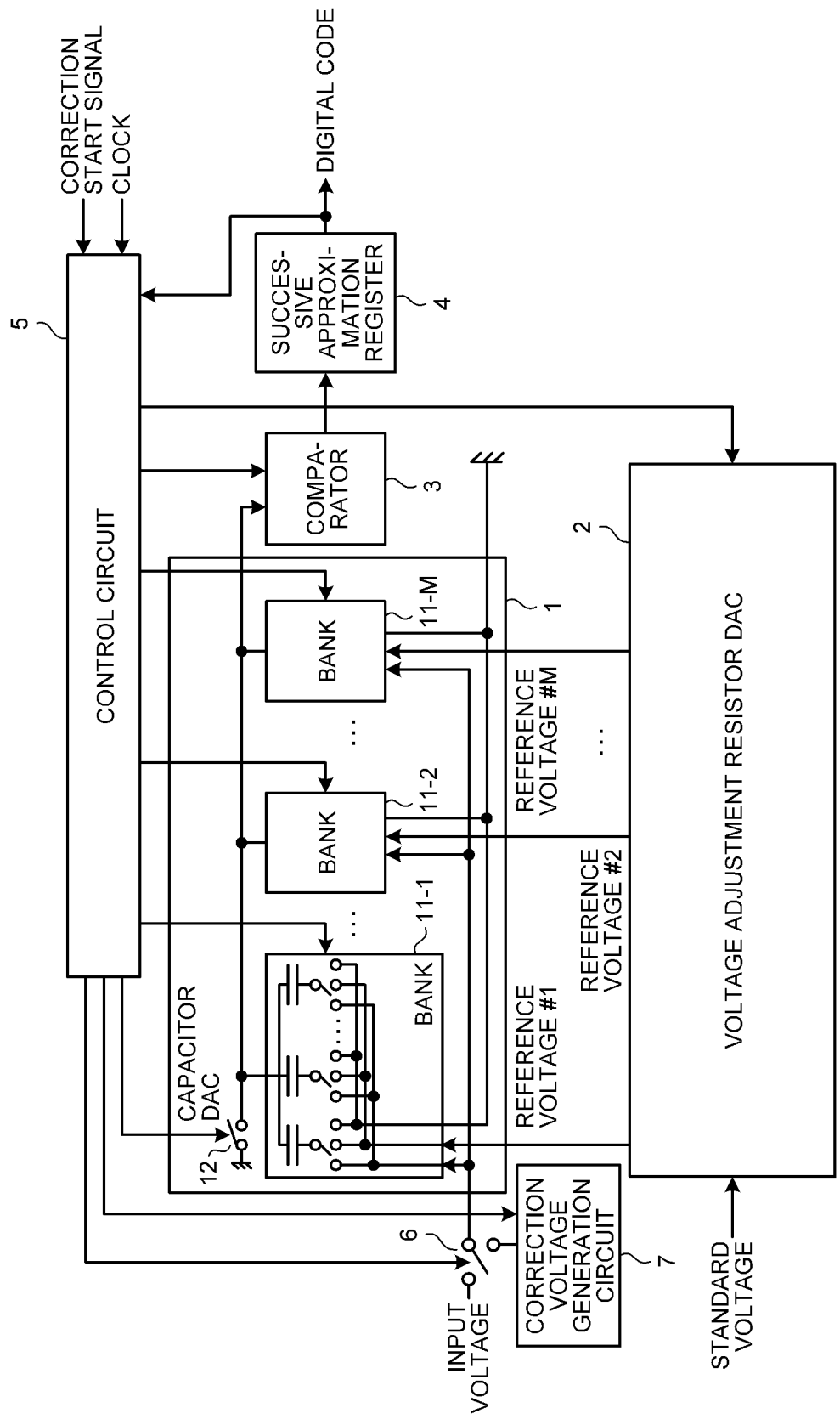
FIG. 1 is a block diagram of a structure example of an analog-digital converter according to a first embodiment.

FIG. 1 is a block diagram illustrating a structure example of an analog-digital converter (hereinafter referred to as an AD converter) according to the first embodiment. The AD converter according to this embodiment is an analog-digital converter called a successive approximation ADC. As illustrated in FIG. 1, the AD converter includes a capacitor DAC 1, a voltage adjustment resistor DAC 2, a comparator 3, a successive approximation register 4, a control circuit 5, a switch 6, and a correction voltage generation circuit 7.

The capacitor DAC 1 includes a switch 12 and capacitor banks 11-1 to 11-M (M represents an integer number of 1 or more). Each of the capacitor banks 11-1 to 11-M includes N (N represents an integer number of 1 or more) number of capacitors (capacitor elements) and N number of switches. The voltage adjustment resistor DAC2 generates a reference voltage #k (k=1, 2, . . . M). The reference voltage #k is supplied to the capacitor bank 11-$k$ (k=1, 2, . . . M) by the voltage adjustment resistor DAC2. The comparator 3 outputs a comparison result corresponding to a difference between a sampled voltage and a voltage corresponding to a connection state of the capacitor element in the capacitor DAC1 in accordance with an output signal from the capacitor DAC1. Note that although the comparison result from the comparator 3 is input to the control circuit 5 via the successive approximation register 4 in this embodiment, the comparison result may be configured to input directly from the comparator 3 to the control circuit 5.

Figure 2:
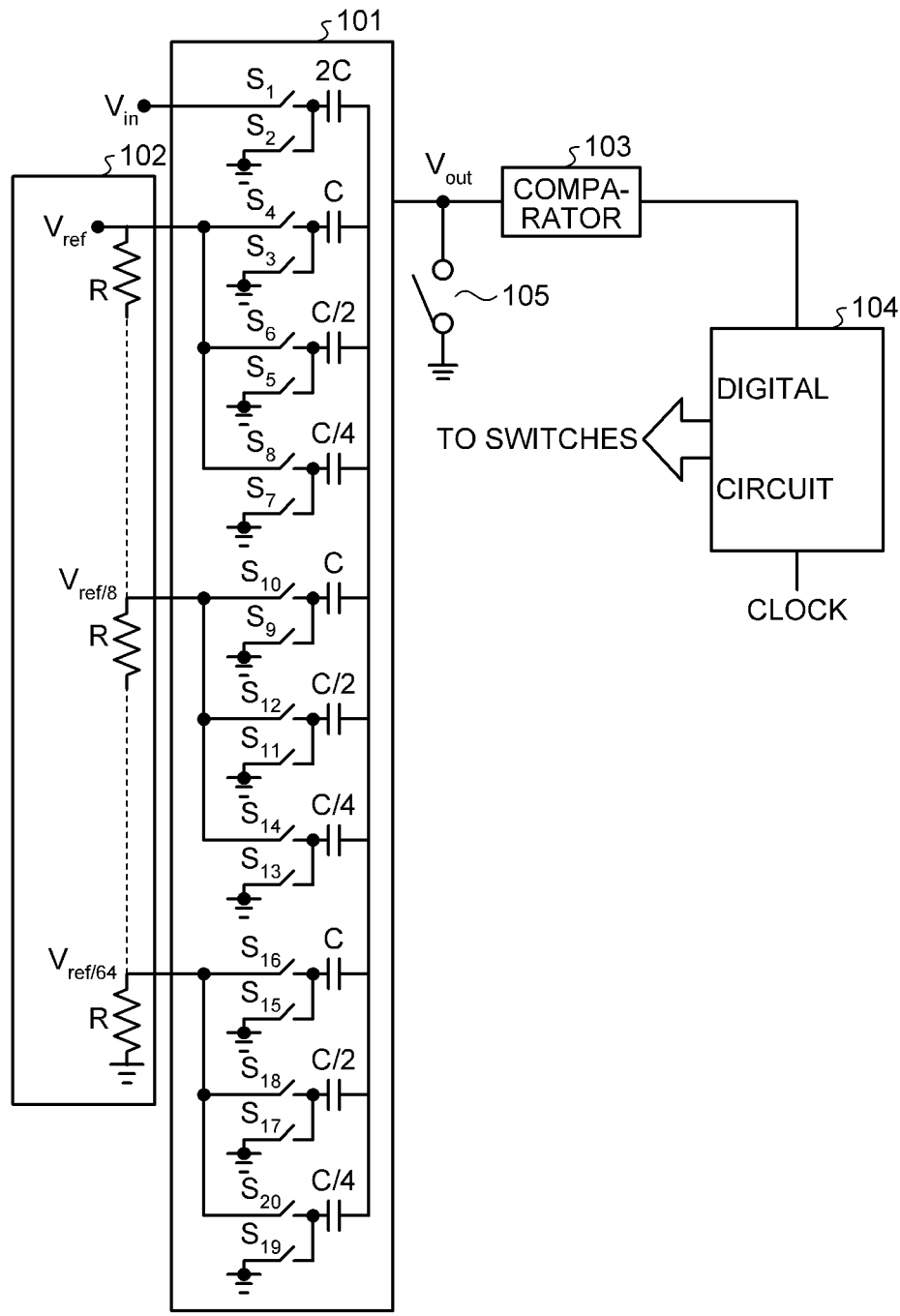
FIG. 2 illustrates a structure example of a successive approximation AD converter according to a comparative example.

Here, basic operation of a successive approximation AD converter using a plurality of reference voltages is described using a structure example of a successive approximation AD converter to be compared. FIG. 2 illustrates the structure example of the successive approximation AD converter to be compared. The successive approximation AD converter in the comparative example includes a capacitor DAC 101, a resistor DAC 102, a comparator 103, and a successive approximation ADC control circuit (Digital Circuit) 104.

Techniques for reducing the area of the capacitor DAC include a technique in which the capacitor DAC is divided into a plurality of capacitor banks (array) and a different reference voltage is used for each capacitor bank. FIG. 2 illustrates the structure example of the successive approximation AD converter using such plural reference voltages. In this type of AD converter, the reference voltage input to each capacitor bank is weighted based on the voltage (Vref) that determines the input range to the AD converter. The weight of the reference voltage is determined by the resolution performance of the capacitor array. For example, when the capacitor bank includes the upper and lower levels and the upper level has a resolution of Na, the upper level and the lower level correspond to Vref and $Vref/2^{Na}$, respectively.

The AD converter illustrated in FIG. 2 includes a sample capacitor (2C) and three capacitor banks (capacitor array). Each capacitor bank includes three kinds of capacitors, C, C/2, and C/4. The reference voltage of Vref, Vref/8, or Vref/64 is supplied to each capacitor bank. One end of each capacitor is connected to a common terminal (a terminal for connecting all the capacitors to one common signal line), and a signal line for connecting the common terminal is connected to the input of the comparator 103.

The basic operation of this circuit includes (a) signal sampling and (b) successive approximation. As for (b) successive approximation, the conversion is successively performed for each bit in accordance with the necessary resolution performance like (b-1) MSB (Most Significant Bit) conversion cycle for performing MSB conversion cycle, (b-2) (MSB-1) conversion cycle for converting a bit that is one bit lower than MSB, . . . .

As for (a) signal sampling, a sample (input voltage Vin) is held by a sampling capacitor by turning on a switch 105, a switch S1, and switches S3, S5, S7, S9, S11, S13, S15, S17 and S19 (the other switches are off). In (b) successive approximation, the switch S1 is off and the switch S2 is on, and the states of the other switches depend on each conversion cycle.

In the case of the circuit illustrated in FIG. 2, in the (b-1) MSB conversion cycle, switches S4, S5, S7, S9, S11, S13, S15, S17, and S19 are turned on, and based on the comparison results of the comparator 103 in this state, one of the switches S3 and S4 is turned on (the switch having smaller difference between the input voltage and the reference voltage generated by capacitor DAC 101 when turned on is turned on). In the (b-2) (MSB-1) conversion cycle, switches S6, S7, S9, S11, S13, S15, S17, and S19 are turned on. On this occasion, one of the switches S3 and S4 is turned on in accordance with the conversion result of the (b-1) MSB conversion cycle. When the conversion result of the (b-1) MSB conversion cycle is "1", the switch S4 is turned on; when the conversion result of the (b-1) MSB conversion cycle is "0", the switch S3 is turned on. After that, the conversion cycle is sequentially performed for each bit until LSB. Through this operation, the voltage Vout input to the comparator 103 is obtained by the following formula (1).

$$Vout = -\frac{2}{(3+17/4)}\begin{pmatrix} -V_{in} + \frac{1}{2}D[8]V_{ref} + \frac{1}{4}D[7]V_{ref} + \frac{1}{8}D[6]V_{ref} + \\ \frac{1}{2}D[5]V_{ref2} + \frac{1}{4}D[4]V_{ref2} + \frac{1}{8}D[3]V_{ref2} + \\ \frac{1}{2}D[2]V_{ref3} + \frac{1}{4}D[1]V_{ref3} + \frac{1}{8}D[0]V_{ref3} \end{pmatrix} \quad (1)$$

In this formula, Vref2 represents the reference voltage of the second capacitor bank, and Vref3 represents the reference voltage of the third capacitor bank. The reference voltage of the first capacitor bank is Vref, which is the same as the voltage for determining the input range of the AD converter. D[8] to D[0] represent digital codes (i.e., digital signals) obtained from the comparator 103. As illustrated in FIG. 2, each reference voltage is Vref2=Vref/8 and Vref3=Vref/64; therefore, the above formula (1) becomes the following formula (2).

$$Vout = \frac{2}{(3+17/4)}\begin{pmatrix} -V_{in} + \frac{1}{2}D[8]V_{ref} + \frac{1}{4}D[7]V_{ref} + \frac{1}{8}D[6]V_{ref} + \\ \frac{1}{16}D[5]V_{ref} + \frac{1}{32}D[4]V_{ref} + \frac{1}{64}D[3]V_{ref} + \\ \frac{1}{128}D[2]V_{ref} + \frac{1}{256}D[1]V_{ref} + \frac{1}{512}D[0]V_{ref} \end{pmatrix} \quad (2)$$

According to the formula (2), highly accurate AD conversion is possible as long as the resistor DAC 102 as the reference voltage generation circuit can generate accurately the voltages with binary weights that are ⅛ and 1/64 of the Vref as the Vref2 and Vref3, respectively. However, when the binary weight with respect to the Vref2 and Vref3 is not accurate, the AD conversion between the second capacitor bank and the third capacitor bank causes an error, resulting in coding failure. In the use of the plural reference voltages in this manner, the variation in reference voltage causes the error in conversion result.

Figure 3:
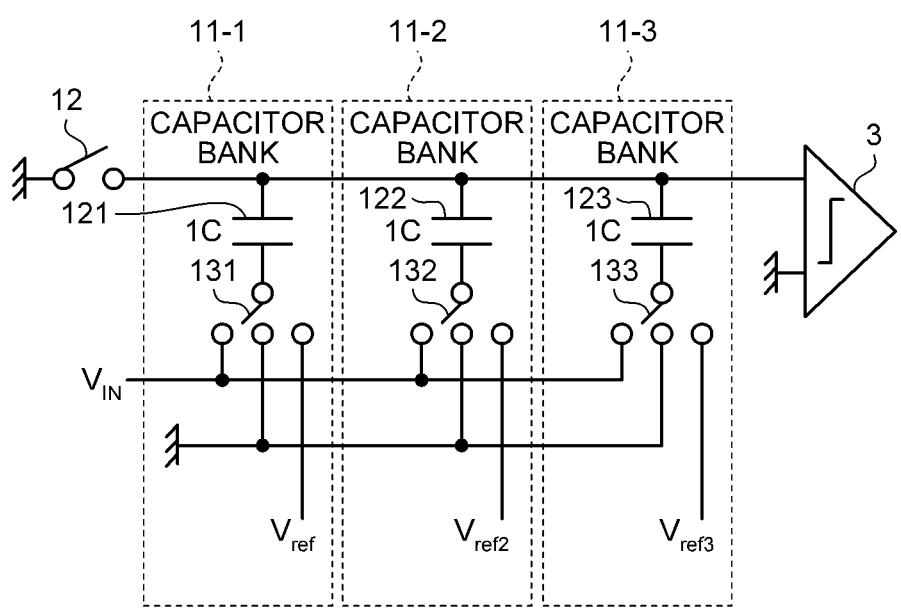
FIG. 3 illustrates a structure example of a capacitor DAC according to the first embodiment.

FIG. 3 illustrates a structure example of the capacitor DAC1 of this embodiment. In FIG. 3, the number of capacitor banks is three: capacitor banks 11-1 to 11-3. For simplicity, each capacitor bank includes one capacitor (capacitance value: 1C). Specifically, the capacitor bank 11-1 includes a capacitor (capacitor element) 121 and a switch 131, the capacitor bank 11-2 includes a capacitor 122 and a switch 132, and the capacitor bank 11-3 includes a capacitor 123 and a switch 133. Therefore, each capacitor bank corresponds to one bit, and in the structure example of FIG. 3, AD conversion for three bits can be performed.

Note that in the example of FIG. 2, a sampling capacitor for holding the input voltage Vin (sample) is provided; however, in FIG. 3, the sampling capacitor is not provided and each capacitor also functions to sample and hold. Each capacitor is connectable to Vin, and in (a) signal sampling, the switch 12 is on and the switches 131, 132, and 133 are connected to Vin.

Figure 4:
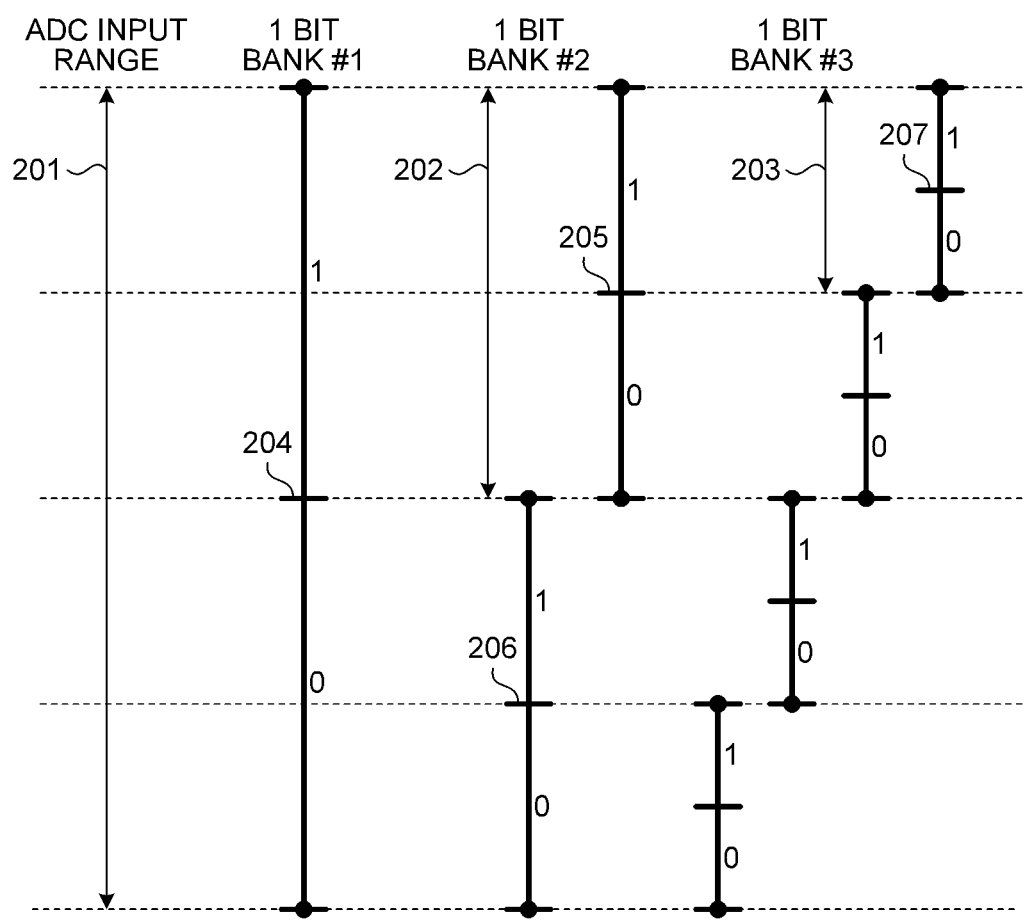
FIG. 4 schematically illustrates the successive approximation AD conversion according to the comparative example.

The operation when an AD conversion method of the successive approximation type in the comparative example is carried out in the structure example of FIG. 3 is described. First, description is made for the basic operation of the successive approximation AD converter in the comparative example in the ideal case with no variation in reference voltage. FIG. 4 schematically illustrates the successive approximation AD conversion in the comparative example. FIG. 4 schematically illustrates the successive approximation AD conversion based on the structure of the capacitor bank illustrated in FIG. 3. The vertical axis in FIG. 4 represents the voltage, while the horizontal axis represents the time (conversion cycle in each bit in (b) successive approximation). The reference voltage Vref is supplied to the capacitor bank 11-1, the reference voltage Vref2=Vref/2 is supplied to the capacitor bank 11-2, and the reference voltage Vref3=Vref/4 is supplied to the capacitor bank 11-3. In the following description of this embodiment, the capacitor bank 11-k (k=1, 2, 3) is abbreviated as bank #k.

FIG. 4 illustrates the input range and the threshold voltage of each of the banks #1, #2, and #3 (that is, the capacitor banks 11-1, 11-2, and 11-3). The threshold voltage indicates the voltage at a boundary between the output codes of "0" and "1" of each bit. An input range 201 indicates the input range of the bank #1, an input range 202 indicates the input range of the bank #2, and an input range 203 indicates the input range of the bank #3. Moreover, a threshold voltage 204 indicates the threshold voltage of the bank #1, threshold voltages 205 and 206 indicate the threshold voltages of the bank #2, and a threshold voltage 207 indicates the threshold voltage of the bank #3.

As for the AD conversion method of the successive approximation type in the comparative example, in (b) successive approximation, conversion cycle of each bit is performed in the order from MSB (corresponding to the bank #1). The input range of each capacitor bank is the reference voltage of each bank. Therefore, the input range 201 of the bank #1 is Vref, the input range 202 of the bank #2 is Vref/2, and the input range 203 of the bank #3 is Vref/4. As long as the reference voltage is set ideally, accurate AD conversion can be performed without overlapping (overlap) between the input ranges and without space (lack) between the ranges.

Specifically, for example, when the conversion result of the bank #1 is "1", the input range 202 of the bank #2 corresponds to the upper half above the threshold voltage 204, which is the center of the input range 201 of the bank #1. Moreover, when the conversion result of the bank #1 is "0", the input range 206 of the bank #2 corresponds to the lower half below the threshold voltage 204, which is the center of the input range 201 of the bank #1. When the conversion result of the bank #1 is "1", the threshold voltage 205 of the bank #2 corresponds to the center of the input range 202. That is to say, the threshold voltage 205 of the bank #2 when the conversion result of the bank #1 is "1" is at the position corresponding to ¼ from the top of the input range 201 of the bank #1. In a similar manner, the threshold voltage 206 of the bank #2 when the conversion result of the bank #1 is "0" is at the position corresponding to ¼ from the bottom of the input range 201 of the bank #1.

Without particular limitation, a method similar to that of the comparative example can be applied to the normal AD conversion operation in the AD converter according to this embodiment, that is, to the AD conversion operation on the input voltage (external voltage) that is subjected to the AD conversion. Specifically, the control circuit 5 connects the input voltage and the capacitor DAC1 by controlling the switch 6. Then, the control circuit 5 controls each switch in the capacitor DAC1 to perform (a) signal sampling and (b) successive approximation. In (b) successive approximation, the capacitor corresponding to the bit as the conversion target is connected to the reference voltage in each conversion cycle. Then, the output from the capacitor DAC1 is input to the comparator 3, and based on the comparison result from the comparator 3, a bit value corresponding to the successive approximation register 4 is set. Then, upon the completion of the conversion cycle on all of the bits, the value set in the successive approximation register 4 is output as the AD conversion result (digital code (digital signal)). Note that overlapping (over-range) between the input ranges is sometimes provided on purpose, and in that case, conversion is also performed from the higher bit successively as in the comparative example.

Figure 5:
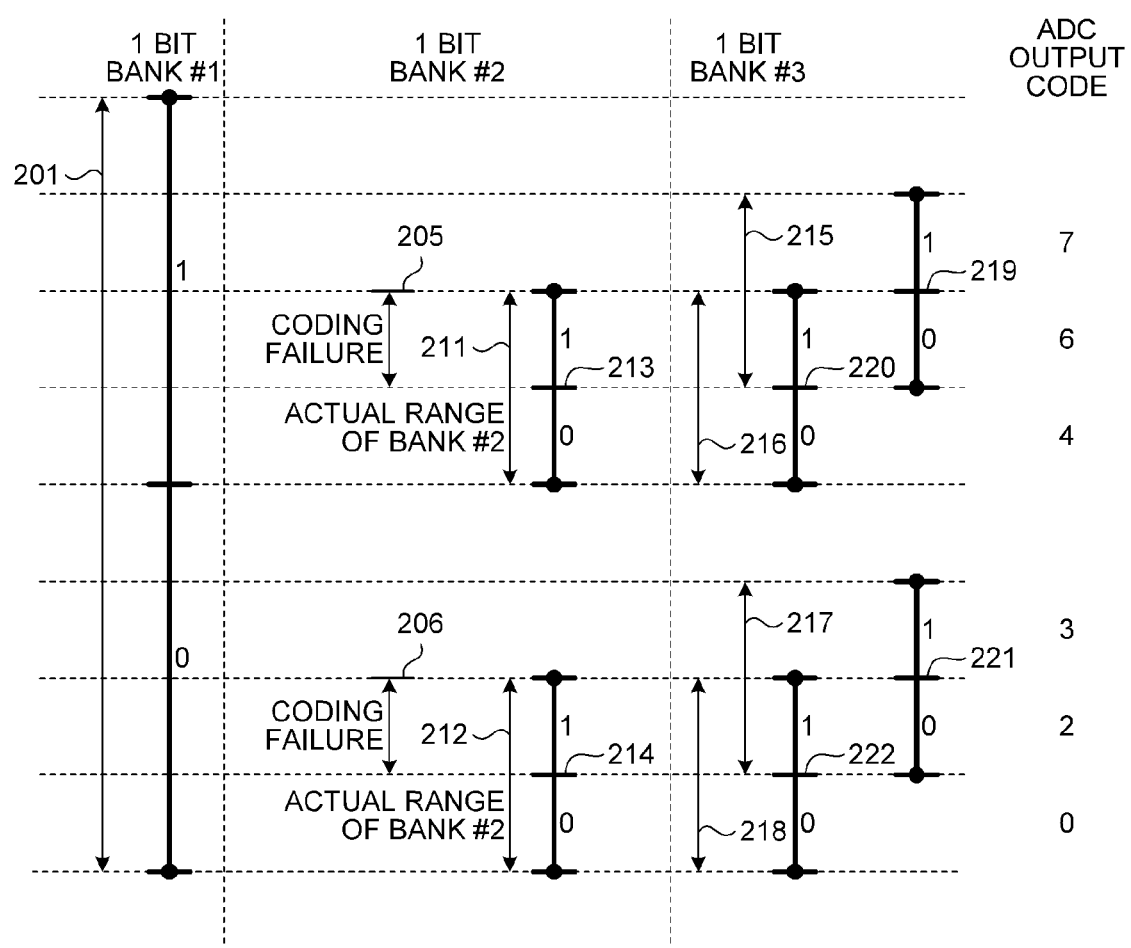
FIG. 5 schematically illustrates the successive approximation AD conversion according to the comparative example when the reference voltage of a bank #2 has an error.

FIG. 5 schematically illustrates the successive approximation AD conversion in the comparative example when an error is caused in the reference voltage of the bank #2. In the example of FIG. 5, the case in which the reference voltage of the bank #2 is smaller than an ideal value is assumed. The input range 201 is similar to that in the example of FIG. 4. The threshold voltages 205 and 206 indicate the threshold voltages of the bank #2 in the ideal case illustrated in FIG. 4. Input ranges 211 and 212 indicate the actual input ranges of the bank #2 when an error is caused in the reference voltage of the bank #2. Input ranges 215 to 218 indicate the actual input ranges of the bank #3 when an error is caused in the reference voltage of the bank #2. Threshold voltages 213 and 214 indicate the actual threshold voltages of the bank #2 when an error is caused in the reference voltage of the bank #2. Threshold voltages 219 to 222 indicate the actual threshold voltages of the bank #3 when an error is caused in the reference voltage of the bank #2.

As illustrated in FIG. 5, the threshold voltages 213 and 214 are lower than the ideal threshold voltages 205 and 206, and this difference causes coding failure. Specifically, when the error is caused in reference voltage as illustrated in FIG. 5, overlapping is caused in the actual input range of the bank #3, so that the "1" and "5" are omitted from the output code (ADC Output Code) of the AD converter illustrated in the right end of FIG. 5, which results in coding failure.

The AD converter according to this embodiment has a function of correcting the reference voltage by having the control circuit 5 control the voltage adjustment resistor DAC 2 for preventing the coding failure in the occurrence of error in reference voltage.

Figure 6:
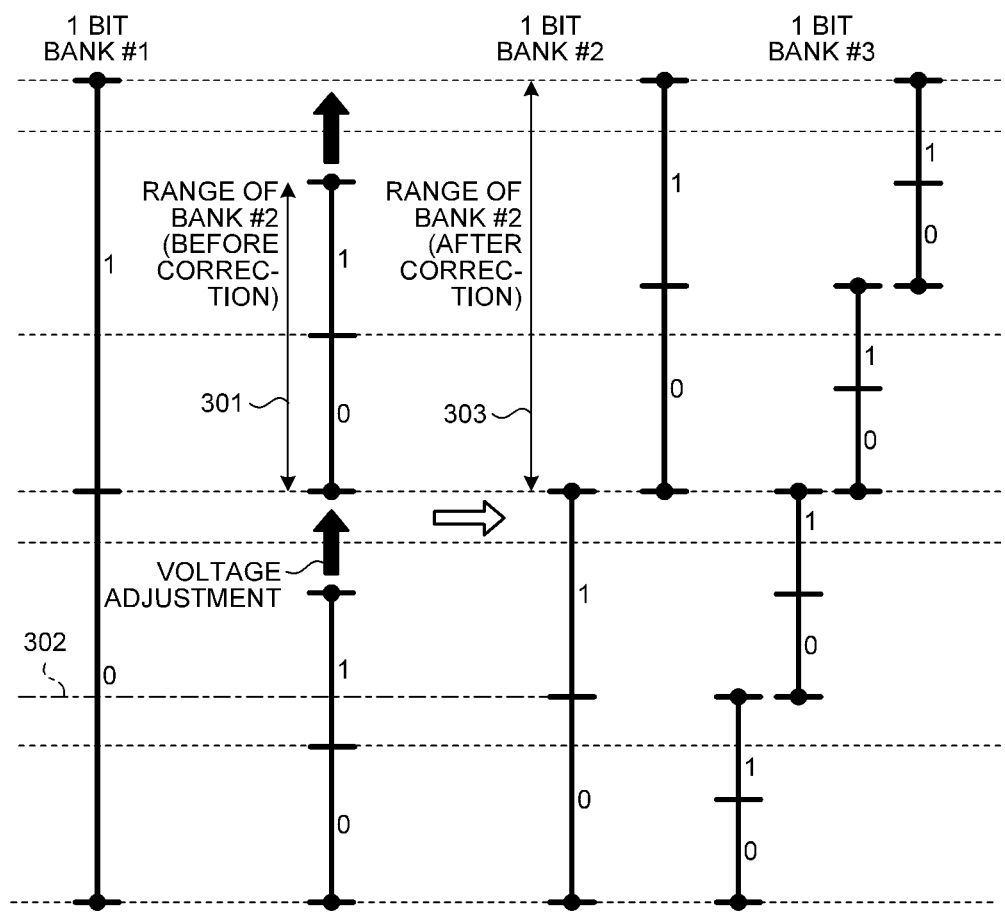
FIG. 6 schematically illustrates the correction of the reference voltage according to the first embodiment.

FIG. 6 schematically illustrates the correction of the reference voltage according to this embodiment. In the example of FIG. 6, the correction is made in the structure example of FIG. 3 when the reference voltage of the bank #2 is smaller than the ideal value. An input range 301 indicates the input range of the bank #2 before the correction. In this case, the reference voltage of the bank #2 is corrected in this embodiment. Specifically, the control circuit 5 controls the switch 6 for connecting the correction voltage generation circuit 7 and the capacitor DAC1 to each other, and the correction voltage generation circuit 7 inputs the known correction voltage to the capacitor DAC1. Then, the control circuit 5 corrects the reference voltage based on the conversion result of the bit at or below the bit corresponding to the capacitor bank as the correction target.

In the example of FIG. 6, a correction voltage 302 of Vref/4 is input to the capacitor DAC1. In the example of FIG. 6, by inputting the correction voltage 302, if the voltage is an ideal reference voltage, the conversion of the bank #1 (first bit) should output "0", the conversion of the bank #2 (second bit) should output "0" and the conversion of the bank #3 (third bit) should output "1". Note that in the bank #2, the Vref/4 is the ideal threshold voltage; when the Vref/4 is input, "0" is output and when more than Vref/4 is input, "1" is output.

Meanwhile, when the reference voltage of the bank #2 is smaller than the ideal value and has an error as illustrated in FIG. 6, the input range 301 is reduced to lower the threshold voltage. Therefore, when the reference voltage of the bank #2 includes the error indicated in FIG. 6, the input of the correction voltage 302 leads to the output of "1" from the conversion of the bank #2 and the output of "0" from the conversion of the bank #3.

In this embodiment, the control circuit 5 adjusts the reference voltage to be supplied to the bank as the correction target by controlling the voltage adjustment resistor DAC2 based on the conversion result of the bit at or below the bit corresponding to the bank as the correction target. When the bank #2 is the correction target, the conversion results of second and third bits are referred. In the example of FIG. 6, the conversion result of "10" is obtained before the correction. The control circuit 5 holds the correct conversion result (hereinafter referred to as ideal code) corresponding to the value of the correction voltage, and compares the bit ("01" in this example) as the reference target among the ideal code and the conversion result obtained by the input of the correction voltage. When the ideal code does not match the conversion result, the reference voltage is adjusted. In the example of FIG. 6, the ideal code does not match the conversion result; therefore, the voltage adjustment resistor DAC2 is controlled so as to boost the reference voltage to be supplied to the bank #2, and stops the boosting when the conversion result is "01". This can set the reference voltage to be supplied to the bank #2 at the correct value. The voltage adjustment for the boosting is performed in a digital manner, for example, and by setting the adjustment step sufficiently smaller than 1 LSB of the bank #1, accurate voltage adjustment can be performed.

Note that even though the ideal code matches the conversion result, it does not necessarily mean the reference voltage is right. For example, when the reference voltage of the bank #2 is larger than the ideal value, the input of the correction voltage 302 of Vref/4 may lead to the output of "01". Therefore, when the correction voltage 302 of Vref/4 is input and the values of the second and third bits match the ideal code, it is necessary to further check whether the reference voltage of the bank #2 is larger than the ideal value. In a method therefor, for example, the reference voltage is dropped and adjusted to the boundary at which the conversion result is "10".

The value of the correction voltage is not limited to Vref/4 and may be any number as long as it is a known value that can determine the presence or absence of error of the conversion result by the input to the capacitor DAC1. Alternatively, a plurality of correction voltages may be generated and the reference voltages may be adjusted based on the conversion results in the case where the correction voltages are input. For example, whether the reference voltage is large or small is determined by sequentially inputting two kinds of correction voltages above and below the threshold voltage and using the conversion result obtained by inputting the correction voltages. After that, the correction voltage that matches the threshold voltage may be input to finely adjust the reference voltage by boosting or bucking the reference voltage as aforementioned. Further alternatively, the correction voltage may be set at different values for each bit as the correction target.

Thus, the reference voltage is corrected by performing the AD conversion operation using a capacitor bank and subsequent capacitor banks using the reference voltage as the correction target in this embodiment. Therefore, it is assumed in the correction processing that bits below the bit as the correction target have correct reference voltages. Accordingly, For example, the correction processing can be performed recursively in order from the least significant bit to the higher bit.

Figure 7:
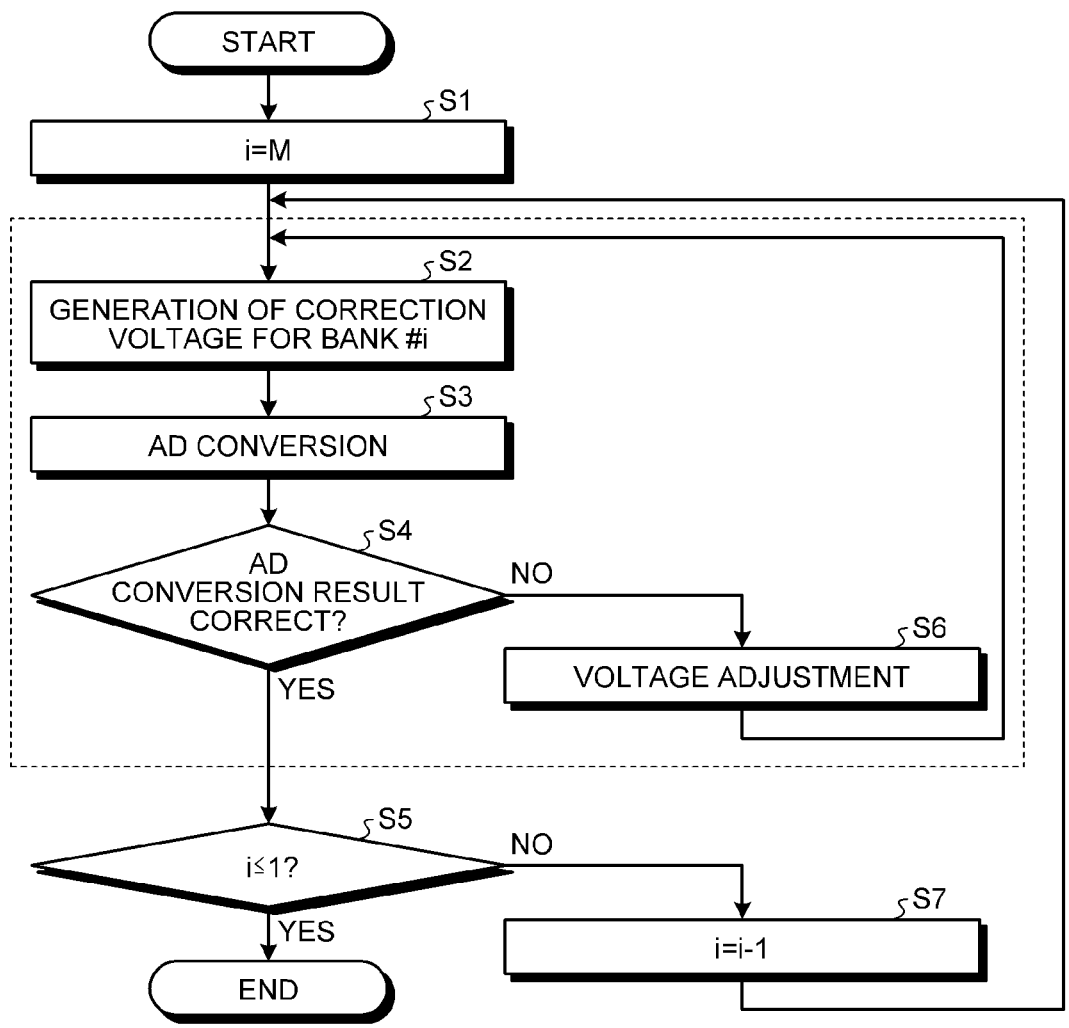
FIG. 7 is a flow chart of an example of a procedure for correcting the reference voltage according to the first embodiment when the correction processing is performed from the lowest capacitor bank.

FIG. 7 is a flow chart illustrating an example of the procedure for correcting the reference voltage of this embodiment in the case where the correction processing is performed from the lowest capacitor bank. The variable i representing the capacitor bank as the correction target is set as i=M (Step S1).

As illustrated in FIG. 1, the capacitor DAC1 includes M number of capacitor banks 11-1 to 11-M (bank #1 to bank #M). The capacitor bank 11-1 (bank #1) corresponds to MSB, while the capacitor bank 11-M (bank #M) corresponds to LSB (Least Significant Bit).

The control circuit 5 controls the correction voltage for inputting to the capacitor DAC1 (to generate the correction voltage for the bank #i) (Step S2), and performs AD conversion using the bank #i and subsequent banks (banks corresponding to the bits at and below the bit corresponding to the bank #i) (Step S3). Then, the control circuit 5 determines whether the AD conversion result is right (Step S4).

When the AD conversion result is right (Yes in Step S4), the control circuit 5 determines whether i is 1 or less (Step S5) and ends the correction processing when i is 1 or less (Yes in Step S5). When i is not 1 or less (No in Step S5), the processing returns to Step S2 assuming that i=i−1 (Step S7). When the AD conversion result is not right (No in Step S4), the control circuit 5 adjusts the reference voltage (Step S6), the processing returns to Step S2.

In Step S4, in addition to the simple determination on whether the AD conversion result matches the ideal code, confirmation as to whether the threshold voltage in the case where the AD conversion result matches the ideal code is at the ideal position is performed. That is to say, confirmation as to whether, in the case where the AD conversion result matches the ideal code, slight bucking (or boosting) of the reference voltage prevents the match with the ideal code is performed. In the case where the reference voltage does not match the ideal code soon after the reference voltage is bucked (or boosted), it can be confirmed that the threshold voltage is at the proper position; in the case where the reference voltage matches the ideal code soon, the threshold voltage is not at the proper position, and the processing proceeds to No in Step 4 and the voltage adjustment (Step S6) is performed to continue the bucking (or boosting) of the reference voltage till the boundary at which the match with the ideal code is lost.

The example of the correction processing performed from the lowest capacitor bank has been described; however, the order of the correction processing is not limited thereto. For example, the correction processing may be performed from the uppermost capacitor bank or from the intermediate uppermost capacitor bank.

Figure 8:
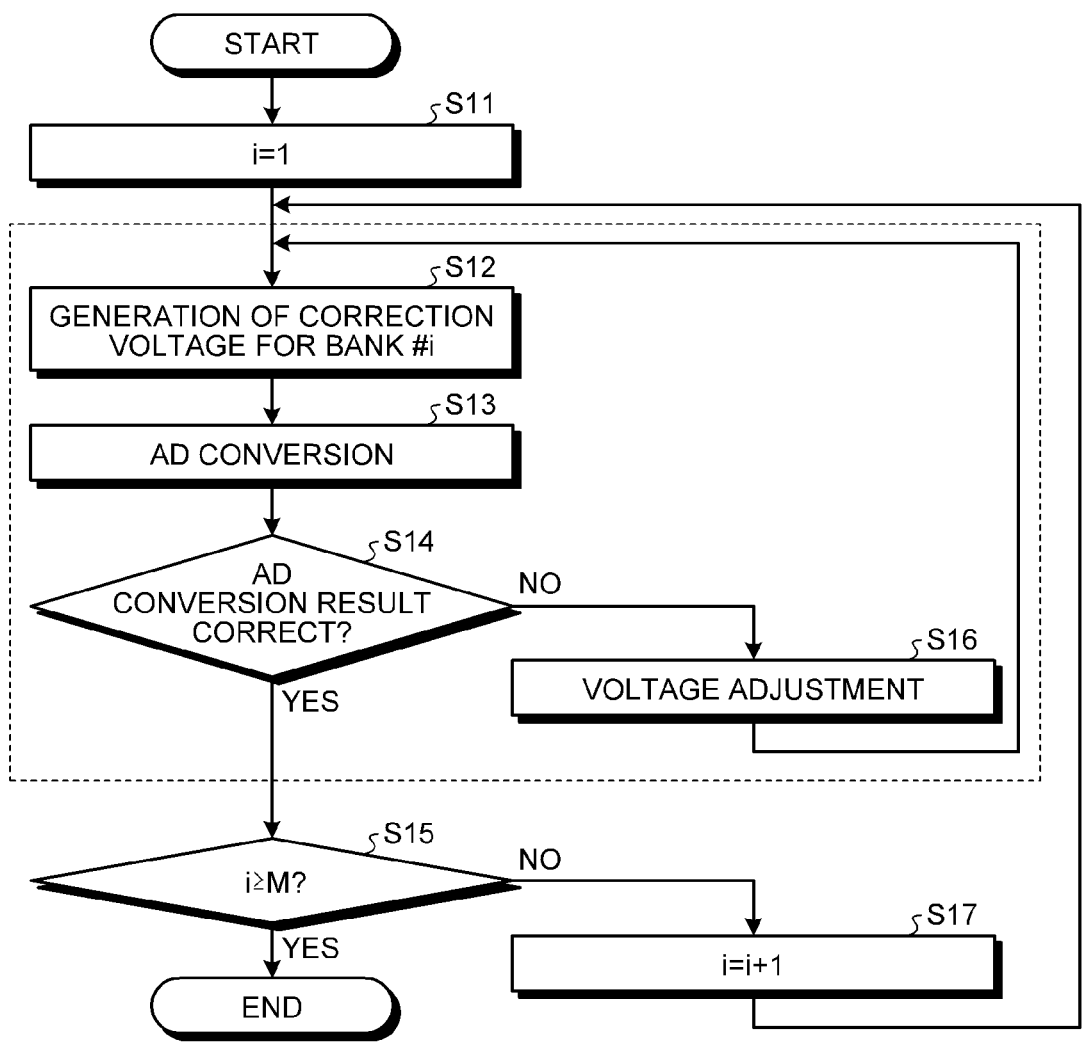
FIG. 8 is a flow chart of an example of a procedure for correcting the reference voltage according to the first embodiment when the correction processing is performed from the uppermost capacitor bank.

FIG. 8 is a flow chart illustrating an example of the procedure for correcting the reference voltage of this embodiment in the case where the correction processing is performed from the uppermost capacitor bank. The variable i representing the capacitor bank as the correction target is set as i=1 (Step S11). Steps S12 to S14 are similar to Steps S2 to S4 of FIG. 7. After Step S14, the control circuit 5 determines whether i is M or more (Step S15); if i is M or more (Yes in Step S15), the correction processing ends. If i is not M or more (No in Step S15), the processing returns to Step S12 assuming that i=i+1 (Step S17).

In general, since errors of some of the lower bits including the least significant bit are sufficiently small from the viewpoint of the influence on the entire performance of the AD converter, the error does not deteriorate the performance in some cases. In those cases, the correction processing may be performed after some of the lower bits are removed from the correction target.

After the aforementioned correction processing, the control circuit 5 controls the switch 6 for connecting the input voltage and the capacitor DAC1 and performs normal AD conversion on the input voltage, thereby allowing the output of the correct AD conversion result.

Alternatively, any voltage may be used instead of the ground voltage illustrated in FIG. 1 as long as a residual signal between the any voltage and the reference voltage as the output of the capacitor DAC1 can be obtained. For example, when a voltage A is used instead of the ground voltage and Vref+A is used as the reference voltage, the differential voltage between the voltage A and the reference voltage Vref+A is Vref, which can achieve the operation similar to the above operation.

In the case of using a differential circuit, the same operation can be achieved without ground voltage by connecting (short-circuiting) terminals corresponding to the ground voltage (ground voltage) of the circuits. Thus, the AD converter according to this embodiment does not necessarily require the ground voltage.

Although this embodiment employs the voltage adjustment resistor DAC2 as the reference voltage generation circuit for supplying the reference voltage, a reference voltage generation circuit other than the resistor DAC may be used as long as the reference voltage generation circuit can adjust the voltage of the reference voltage to be generated. Even in this case, similarly, the control circuit 5 may control the reference voltage generated by the reference voltage generation circuit.

In this manner, in this embodiment, the correction voltage is input to the capacitor DAC1 and the control circuit 5 adjusts the reference voltage based on the ideal code corresponding to the correction voltage and the AD conversion results. This allows the correction of the displacement in threshold voltage caused by the variation in reference voltage even in the use of plural reference voltages and reduction in error of the AD conversion result.

SECOND EMBODIMENT

Figure 9:
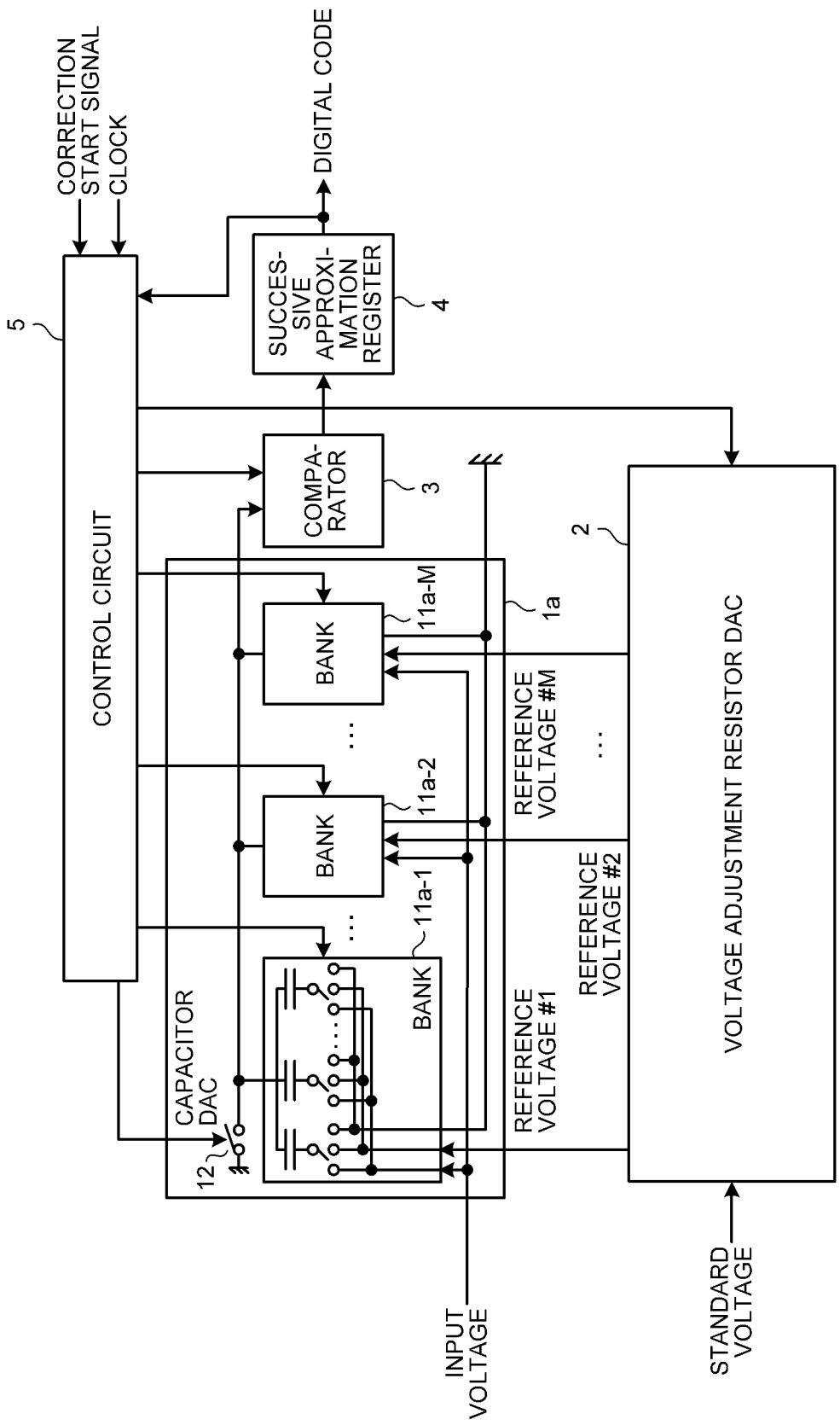
FIG. 9 is a block diagram illustrating a structure example of an AD converter according to a second embodiment.

FIG. 9 is a block diagram illustrating a structure example of an AD converter according to the second embodiment. The AD converter of this embodiment is similar to that of the first embodiment except that the correction voltage generation circuit 7 is eliminated from the AD converter of the first embodiment and a capacitor DAC1a is provided instead of the capacitor DAC1. The components having similar functions as those of the first embodiment are denoted with the same symbols and description of such components is omitted.

Figure 10:
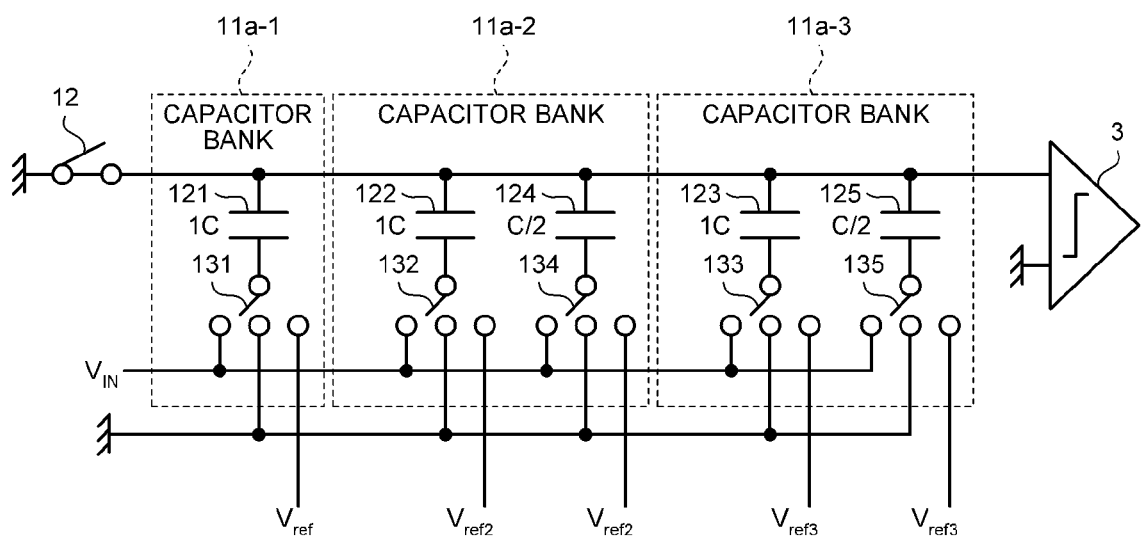
FIG. 10 depicts a structure example of a capacitor DAC according to the second embodiment.

FIG. 10 illustrates a structure example of the capacitor DAC1a of this embodiment. In the structure example of FIG. 10, the number of capacitors is larger than that in the structure example of FIG. 3, and the two-bit AD conversion is possible except for a capacitor bank 11a-1. In the AD converter of FIG. 10, a capacitor bank 11a-2 has ranges overlapping with each other for covering one bit of the output range of the capacitor bank 11a-1 (upper and lower input ranges are additionally provided in addition to the necessary input range in the normal successive approximation AD conversion). A capacitor bank 11a-3 also has ranges overlapping with each other for one bit similarly. For this reason, when the reference voltage of the capacitor bank 11a-1 is Vref, the reference voltage of the capacitor bank 11a-2 is Vref2=Vref and the reference voltage of the capacitor bank 11a-3 is Vref3=Vref/2.

The capacitor bank 11a-1 for one bit includes one capacitor with one 1C (capacitor 121) and a switch 131, the capacitor bank 11a-2 for two bits includes two capacitors with 1C and C/2 (capacitors 122 and 124), and switches 132 and 134, and the capacitor bank 11a-3 for two bits includes two capacitors with 1C and C/2 (capacitors 123 and 125) and switches 133 and 135.

Although both the capacitor banks 11a-2 and 11a-3 are for two bits and have the ranges overlapping with each other here, at least one of the capacitor banks corresponding to the bit at or below the bit corresponding to the capacitor bank as the correction target may have the ranges overlapping with each other.

Figure 11A:
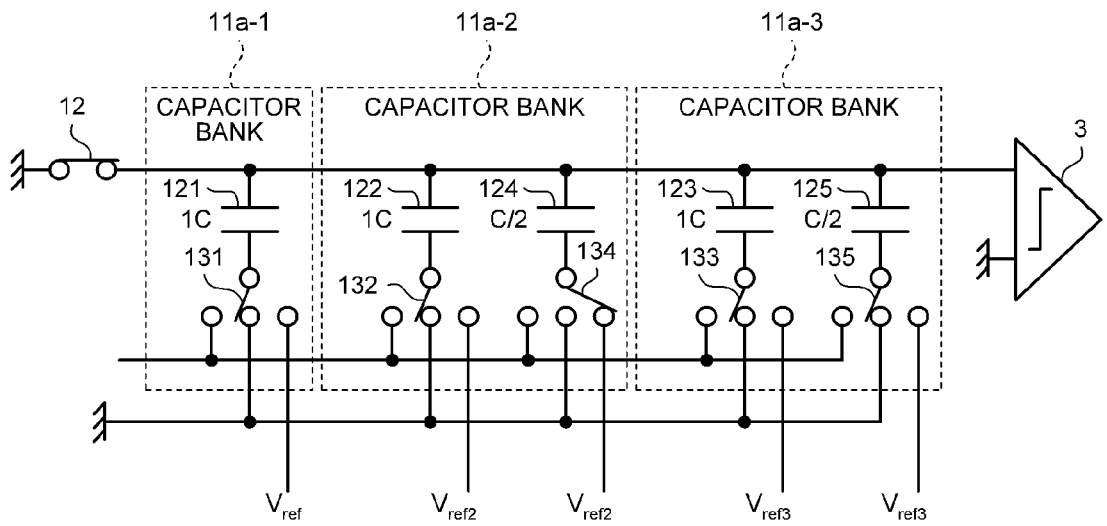
FIGS. 11A and 11B each illustrate a circuit state at the time of correction in the second embodiment.
Figure 11B:
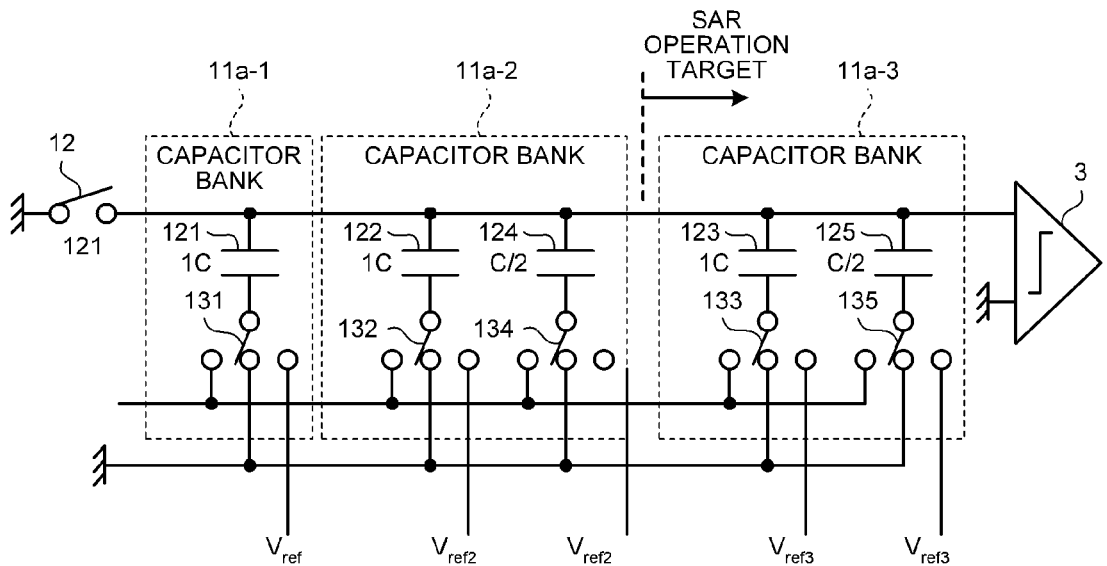

FIGS. 11A and 11B each illustrate the circuit state at the time of correction in this embodiment. The AD converter of this embodiment operates in a mode implementing signal sampling (signal sampling mode) and a mode implementing successive approximation (successive approximation mode). In the examples of FIGS. 11A and 11B, the reference voltage Vref2 of the capacitor bank 11a-2 is the correction target. FIG. 11A illustrates the circuit state in the signal sampling mode; FIG. 11B illustrates the circuit state in the successive approximation mode.

As illustrated in FIG. 11A, in the signal sampling mode, the switch 12 is on and the capacitor 124 of the capacitor bank 11a-2 is connected to Vref2 via the switch 134, and the other capacitors are connected to the ground voltage. As illustrated in FIG. 11B, in the successive approximation mode, the switch 12 is off, the capacitor 122 of the capacitor bank 11a-2 as the correction target and the capacitor 121 of the capacitor bank 11a-1 corresponding to the higher bit are grounded, and the AD conversion is performed using the capacitor 124 of the capacitor bank 11a-2 as the correction target and the capacitor bank 11a-3. In the successive approximation mode, the AD conversion is started not from MSB but from the bit below the capacitor bank utilizing the reference voltage as the correction target.

FIG. 12 schematically illustrates the correction of the reference voltage of this embodiment. In the following description of this embodiment, the capacitor bank 11a-k (k=1, 2, 3) is abbreviated as bank #k. The voltage set in the circuit in FIG. 12 is the voltage obtained by the signal sampling mode of FIG. 11A, and ideally is a voltage 304 corresponding to the position ¼ from the bottom of the input range Vref of the bank #1.

In contrast, when the voltage set in the circuit before the correction is smaller than the ideal value as indicated by the voltage 303 before the correction in FIG. 12, the AD conversion output by the bank #3 represents "1". When the reference voltage Vref2 is boosted from this state, the AD conversion output by the bank #3 eventually represents "2". Since the ideal code in this case is "2", the voltage adjustment stops in the state of "2". When the reference voltage of the bank #3 is ideally Vref/2, the input range of the bank #2 in the "2" state matches the ideal value.

In this manner, by expanding the output code of the AD converter by the over-range (achieving expression of "2" in addition to the expression of "1"), the comparison with the ideal value can be performed using the AD conversion results of the bit below the capacitor bank using the reference voltage as the correction target. This means, differently from the first embodiment, the AD conversion using the capacitor array using the reference voltage as the correction target is not necessary. Moreover, in this embodiment, the correction voltage generation circuit 7 is not provided, and a voltage corresponding to the correction voltage is generated using the reference voltage as the correction target and the capacitor bank using the reference voltage, and the resulting voltage is used as a sampling signal. That is, the voltage corresponding to the correction voltage is determined in accordance with the difference between the reference voltage connected during sampling and the reference voltage connected during the comparison in the capacitor element whose connection destination remains the same during the comparison and whose reference voltage connected during the sampling and reference voltage connected during the comparison are different from each other.

The voltage adjustment is performed in a digital manner, and by setting the adjustment step sufficiently smaller than 1 LSB of the bank #3, and the voltage adjustment can be performed accurately. Moreover, even when the AD conversion output by the bank #3 before the correction is "2", the reference voltage of the bank #2 is possibly larger than the ideal value; in this case, therefore, the reference voltage is kept bucked until the AD conversion output changes from "2" to "1".

As for the normal AD conversion operation (AD conversion operation except during the correction operation) in the AD converter of this embodiment, a method similar to that of the comparative example can be used without particular limitation.

Figure 13:
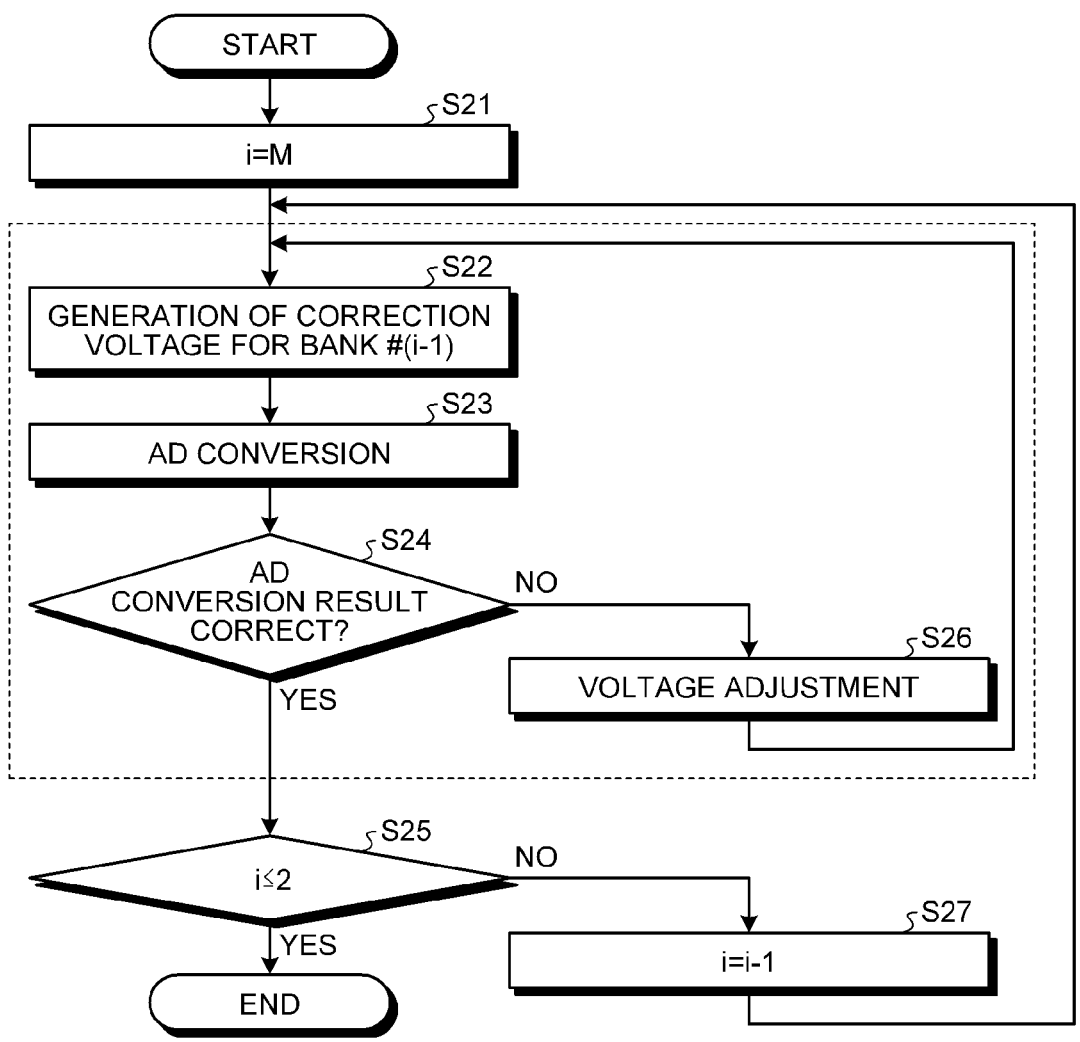
FIG. 13 is a flow chart of an example of a procedure for correcting the reference voltage according to the second embodiment when the correction processing is performed from the lowest capacitor bank.

Since this embodiment performs the correction processing assuming that the lower bit has the proper reference voltage similarly to the first embodiment, the correction processing can be performed recursively in order from the lowest capacitor bank to the higher bit. FIG. 13 is a flow chart illustrating an example of the procedure for correcting the reference voltage of this embodiment when the correction processing is performed from the lowest capacitor bank. First, the variable i representing the capacitor bank as the correction target is set i=M (Step S21). As illustrated in FIG. 9, the capacitor DAC1a includes M number of capacitor banks 11a-1 to 11a-M (bank #1 to bank #M), the capacitor bank 11a-1 (bank #1) corresponds to MSB and the capacitor bank 11a-M (bank #M) corresponds to LSB.

The control circuit 5 set a correct target for the reference voltage to be supplied to the bank #i in the sampling signal mode, controls to sample the reference voltage supplied to the bank #i (Step S22). Next, the AD conversion is performed using a bank corresponding to the bit at or below the bit of the bank #(i−1) (Step S23).

Then, the control circuit 5 determines whether the AD conversion result is correct or not (Step S24). In this Step 24, as described above, in addition to the simple determination on whether the AD conversion result matches the ideal code, confirmation as to whether the threshold voltage in the case where the AD conversion result matches the ideal code is at the ideal position is performed.

If the AD conversion result is correct (Yes in Step S24), the control circuit 5 determines whether i is 2 or less (Step S25). When i is 2 or less (Yes in Step S25), the correction processing ends. When i is not 2 or less (No in Step S25), the processing returns to Step S22 assuming that i=i−1 (Step S27). When the AD conversion result is not correct (No in Step S24), the control circuit 5 adjusts the reference voltage (Step S26) and the processing returns to Step S22.

The example of the correction processing performed from the lowest capacitor bank has been described; however, the order of the correction processing is not limited to this. For example, the correction processing may be performed from the uppermost capacitor bank or from the intermediate highest bit.

Figure 14:
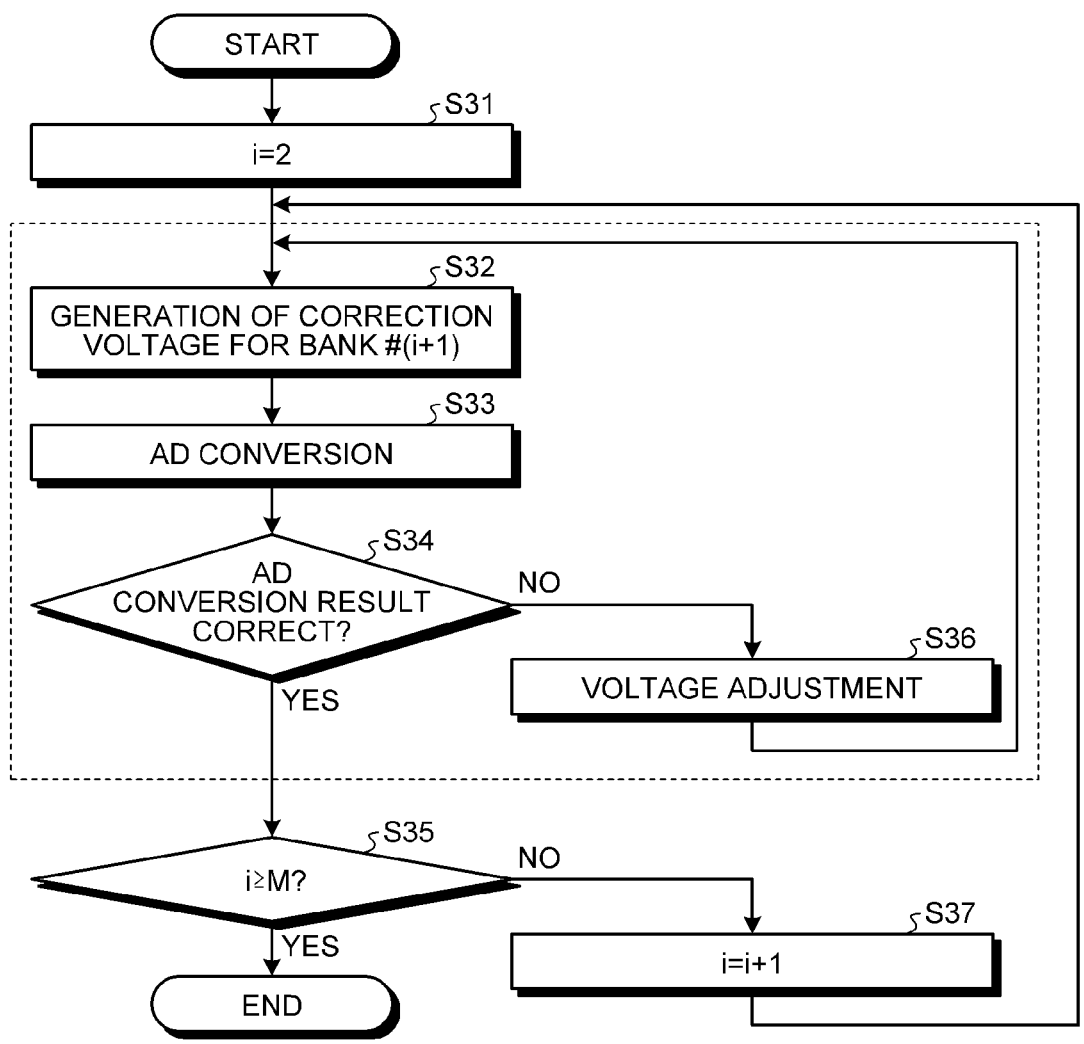
FIG. 14 is a flow chart of an example of a procedure for correcting the reference voltage according to the second embodiment when the correction processing is performed from the uppermost capacitor bank.

FIG. 14 is a flow chart illustrating an example of procedure for correcting the reference voltage of this embodiment when the correction processing is performed from the uppermost capacitor bank. First, the variable i representing the capacitor bank as the correction target is i=2 (Step S31). The control circuit 5 set a correct target for the reference voltage to be supplied to the bank #i in the sampling signal mode, controls to sample the reference voltage supplied to the bank #i (Step S32). Next, AD conversion is performed using the bank corresponding to the bit at or below the bit of the bank #1(i+1) (Step S33). Step S34 is similar to Step S24 of FIG. 13. After Step S34, the control circuit 5 determines whether i is M or more (Step S35), and when i is M or more (Yes in Step S35), the correction processing ends. When i is not M or more (No in Step S35), the processing returns to Step S32 assuming that i=i+1 (Step S37).

Thus, in this embodiment, at least one of the capacitor banks corresponding to the bits below the capacitor bank as the correction target is subjected to over-range and the reference voltage as the correction target is used as the sampling signal without using the correction voltage, and the reference voltage is corrected based on the AD conversion results on the bits below the bit as the correction target. Therefore, the displacement in threshold voltage caused by the variation in reference voltage can be corrected without generating the correction voltage, thereby reducing the error of the AD conversion result.

In the above description, the reference voltage supplied to the bank as the correction target is adjusted, and this corresponds to the adjustment of the relative relation between the reference voltage supplied to the bank as the correction target and the reference voltage supplied to the bank below the correction target. Therefore, instead of adjusting the reference voltage to be supplied to the bank as the correction target in the above example, the reference voltage to be supplied to the bank below that may be adjusted. From the viewpoint of adjusting the relative relation, the effect similar to that of the above example can be obtained. However, the orientation of increase and decrease of the reference voltage is opposite from the above example. That is to say, the adjustment operation is performed by bucking the voltage in the case where the voltage is boosted in the above example, and by boosting the voltage in the case where the voltage is bucked in the above example.

THIRD EMBODIMENT

Figure 15:
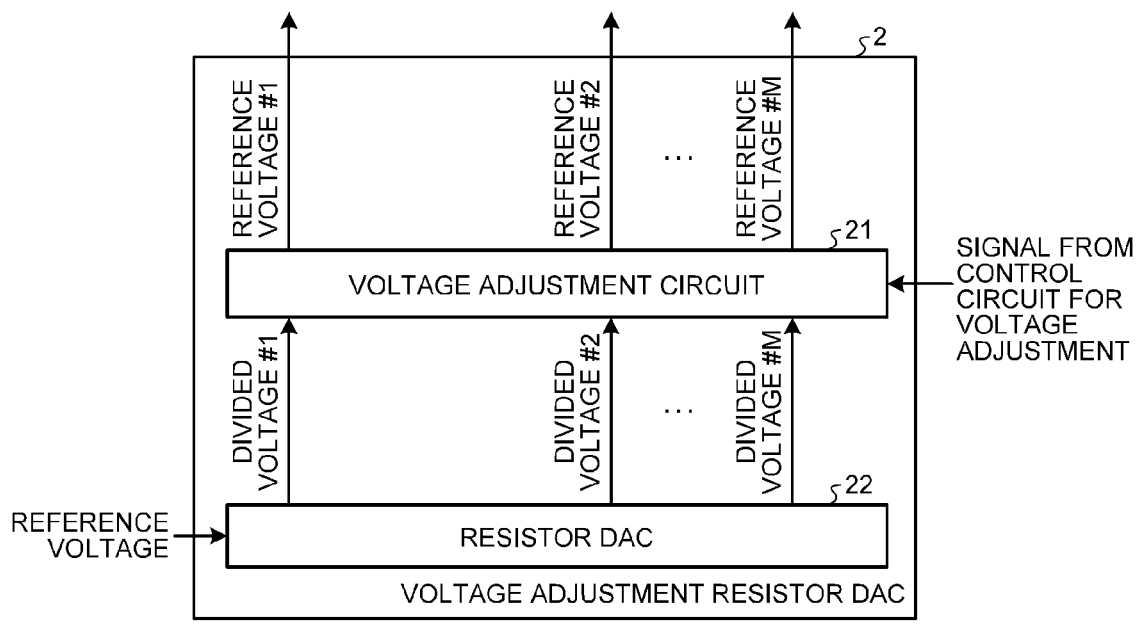
FIG. 15 illustrates a structure example of a voltage adjustment resistor DAC according to a third embodiment.

FIG. 15 illustrates a structure example of the voltage adjustment resistor DAC2 according to the third embodiment. In this embodiment, the specific structure example of the voltage adjustment resistor DAC2 of the AD converter according to the first embodiment or the second embodiment is described. As illustrated in FIG. 15, the voltage adjustment resistor DAC2 of this embodiment includes a voltage adjustment circuit 21 and a resistor DAC22. The resistor DAC22 may have any structure as long as the resistor DAC can output divided voltages #1 to #M relative to the reference voltage. The voltage adjustment circuit 21 adjusts the divided voltages #1 to #M output from the resistor DAC22 based on the control from the control circuit 5 and outputs the voltages as the reference voltages #1 to #M.

Figure 16A:
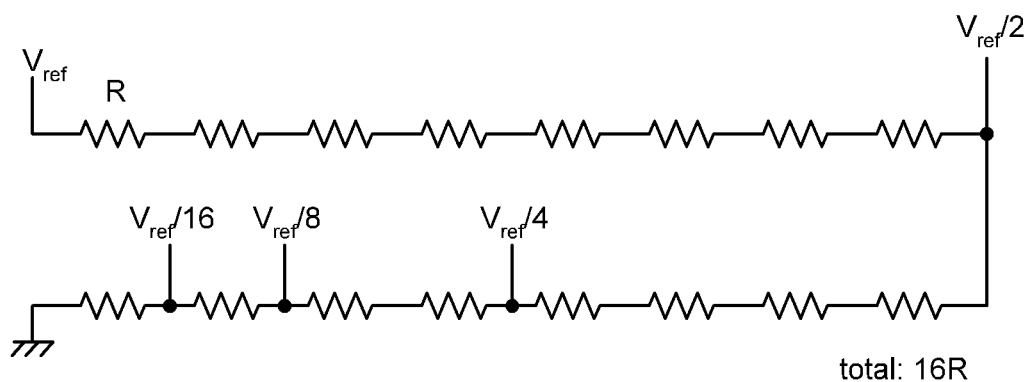
FIGS. 16A and 16B each illustrate a structure example of a resistor DAC.
Figure 16B:
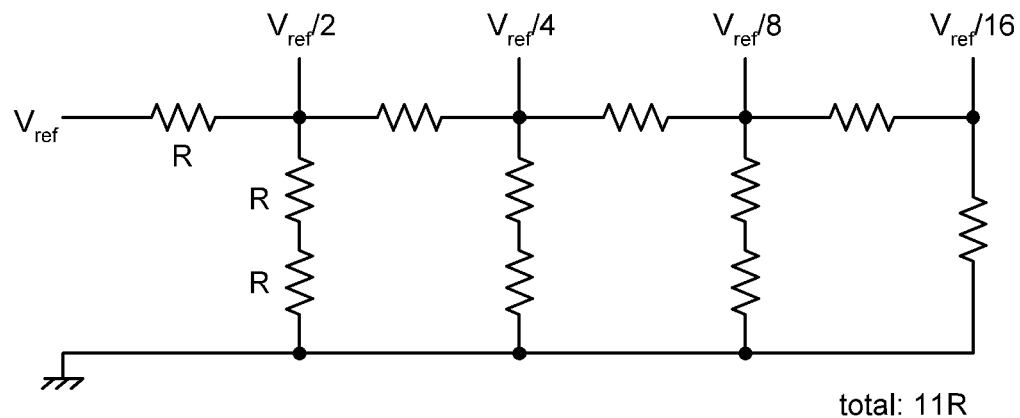

FIGS. 16A and 16B illustrate the structure examples of the resistor DAC22. In general, there are roughly two kinds of methods for configuring the resistor DAC circuit: one is a method in which resistor elements (resistor element R) with a resistance value R are connected in series (FIG. 16A) and the other is a method in which resistors are connected in parallel (FIG. 16B) (called R-2R type). In the case where it is formed using resistor elements R as a basic, 16 resistor elements R are necessary in the series connection type and 11 resistor elements R are used in the R-2R type. The difference in the number of resistors required for forming the circuit tends to increase as the resolution performance is improved. For this reason, when the resistor DAC requiring relatively high resolution performance is formed, the number of elements can be reduced in the R-2R type as compared to the series connection type, thereby achieving the reduction in area (in the case of three bits, the number of resistors is the same in the two methods; in the case of four bits, the R-2R is more advantageous).

Figure 17A:
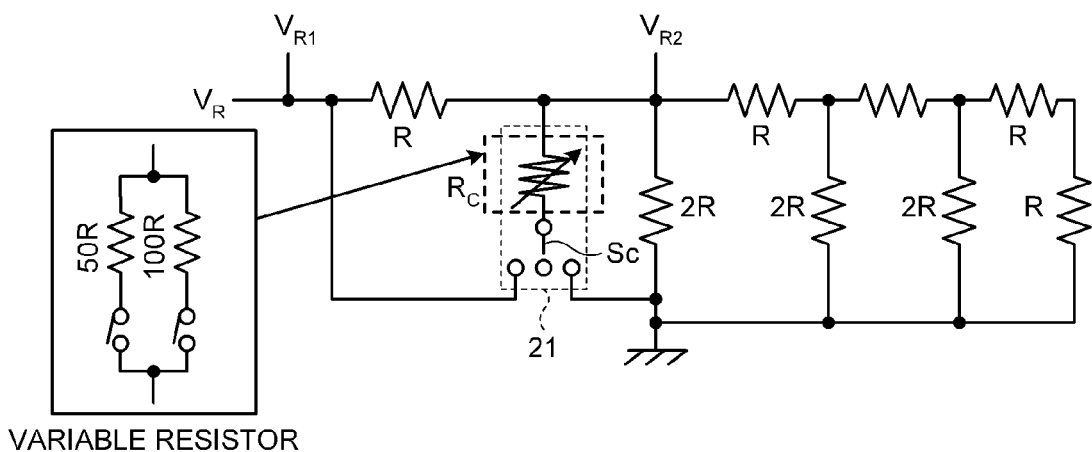
FIGS. 17A to 17C each illustrate a circuit structure example of a voltage adjustment resistor DAC including an R-2R type resistor DAC.
Figure 17B:
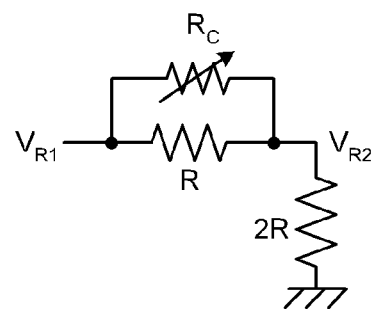
Figure 17C:
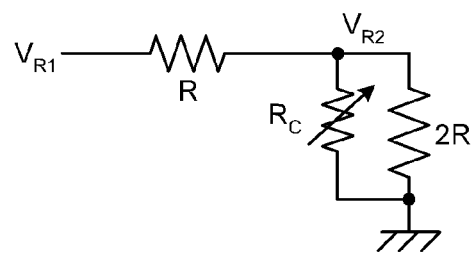

FIGS. 17A and 17B illustrate circuit structure examples of the voltage adjustment resistor DAC2 using the R-2R type resistor DAC22. FIG. 17A illustrates a circuit structure example of the R-2R type resistor DAC22 and the voltage adjustment circuit 21. FIGS. 17B and 17C illustrate the magnified circuit state examples of a part of the circuit structure example illustrated in FIG. 17A. As illustrated in FIG. 17A, the voltage adjustment circuit 21 includes a variable resistor Rc and a boosting/bucking switching switch Sc.

The $V_R$ in FIGS. 17A to 17C correspond to Vref in FIGS. 16A and 16B. In these circuit examples, adjustment of the voltage $V_{R2}$ is assumed. The boosting/bucking switching switch Sc connects one end of the variable resistor Rc to the ground or any node of a $V_{R1}$ at the voltage adjustment. Specifically, in the case of bucking the reference voltage $V_{R2}$, the one end is connected to the ground (FIG. 17C) and connected to the $V_{R1}$ node in the case of boosting (FIG. 17B). The variable resistor Rc has a plurality of resistance values (at least 1 or more) which are sufficiently larger than the resistance value R, and includes a plurality of switches. Although FIG. 17A illustrates the structure example of the variable resistor, the structure of the variable resistor is not limited to this.

Figure 18:
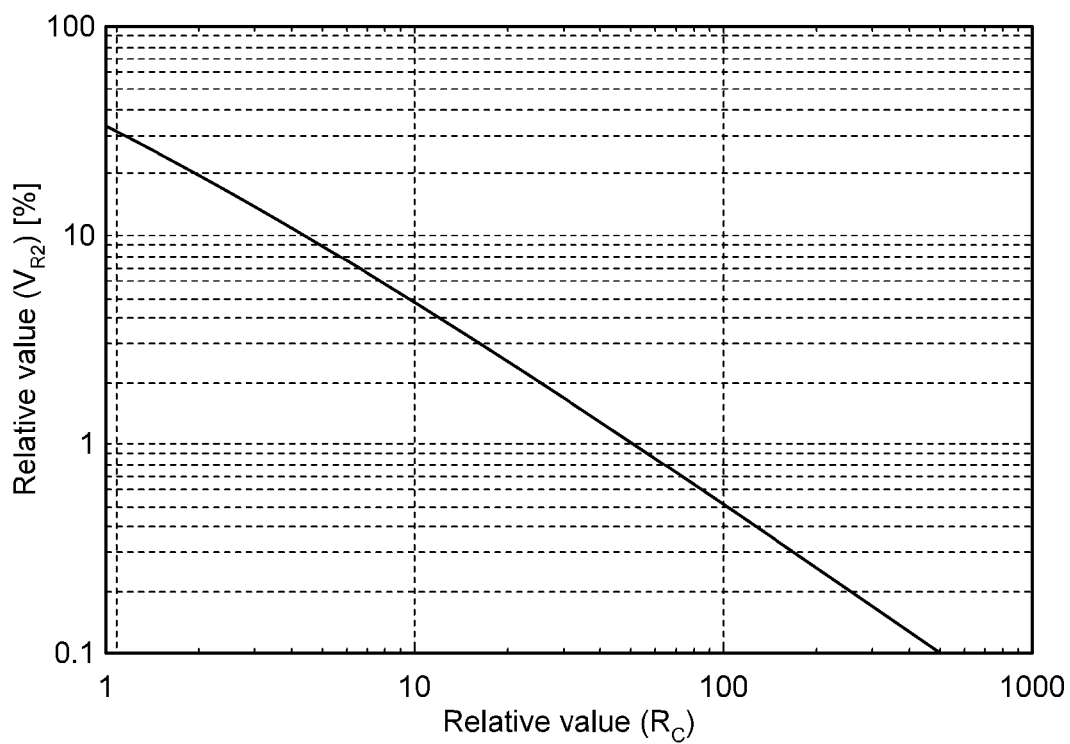
FIG. 18 illustrates an example of a relation between a resistance value of a variable resistor Rc and a reference voltage of $V_{R2}$.

FIG. 18 illustrates an example of the relation between the reference voltage $V_{R2}$ and the resistance value of the variable resistor Rc. This figure indicates the results of calculation assuming that the voltage is boosted. The horizontal axis represents the resistance value (relative value to R) of the variable resistor Rc, while the vertical axis represents the voltage value (relative value to the ideal $V_{R2}$=Vref/2) of $V_{R2}$. Thus, the value of $V_{R2}$ can be adjusted by the resistance value of the variable resistor.

As aforementioned, the R-R2 type includes fewer elements than the series connection type. For example, in the case of 10 bits, the series connection type requires $2^{10}$=1024 resistors in general, which leads to a large circuit area. By having the structure of R-2R type, the number of resistors can be reduced to ⅓₀, which is approximately 3×10=30 resistors. Moreover, the voltage adjustment function can be realized just by adding the variable resistor in the resistor DAC2 in the R-2R type; therefore, the circuit can have a smaller area.

Figure 19:
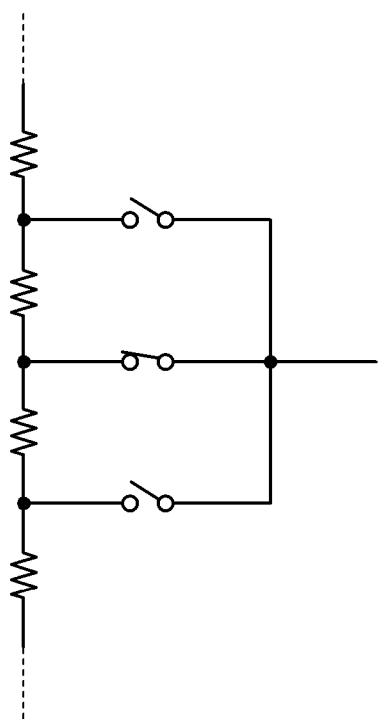
FIG. 19 illustrates a structure example of a voltage adjustment resistor DAC obtained by making a resistor DAC have a voltage adjustment function.

FIG. 19 illustrates a structure example of the voltage adjustment resistor DAC2 in which the resistor DAC has a voltage adjustment function. In this manner, any reference voltage (with resolution performance corresponding to the resistance value of each resistor) can be generated by providing a switch for each resistor and controlling the switch. The control circuit 5 controls the switch of the voltage adjustment resistor DAC2 and adjusts the reference voltage so as to boost or buck the reference voltage.

As thus described, this embodiment has described the circuit structure example of the voltage adjustment resistor DAC2 in the case where the resistor DAC22 is used. In this manner, with the use of the thus structured voltage adjustment resistor DAC2, the AD conversion circuit of the first embodiment or the AD conversion circuit of the second embodiment can be achieved.

FOURTH EMBODIMENT

Next, a voltage correction method according to the fourth embodiment is described. The structure of an AD conversion circuit of this embodiment is similar to that of the first embodiment or the second embodiment.

In the correction of the reference voltage in the first embodiment and the second embodiment, the AD conversion result and the digital code (ideal code) prepared based on each reference voltage are used, and the voltage adjustment circuit is controlled in response to the comparison result between these two values. In this embodiment, the control circuit 5 includes a digital comparator which outputs a binary control signal of "0" or "1" depending on whether the input AD conversion result and ideal code are matched, and an up-down counter that increases or decreases the counter value of a plurality bits in accordance with the value of the input binary control signal from the digital comparator. The control circuit 5 controls the boosting or bucking of each reference voltage by inputting the counter value of the up-down counter to the voltage adjustment resistor DAC2.

By controlling the voltage adjustment using the up-down counter in this manner, the control over the voltage adjustment can be achieved with the simple circuit, thereby reducing the circuit area.

FIFTH EMBODIMENT

Figure 20:
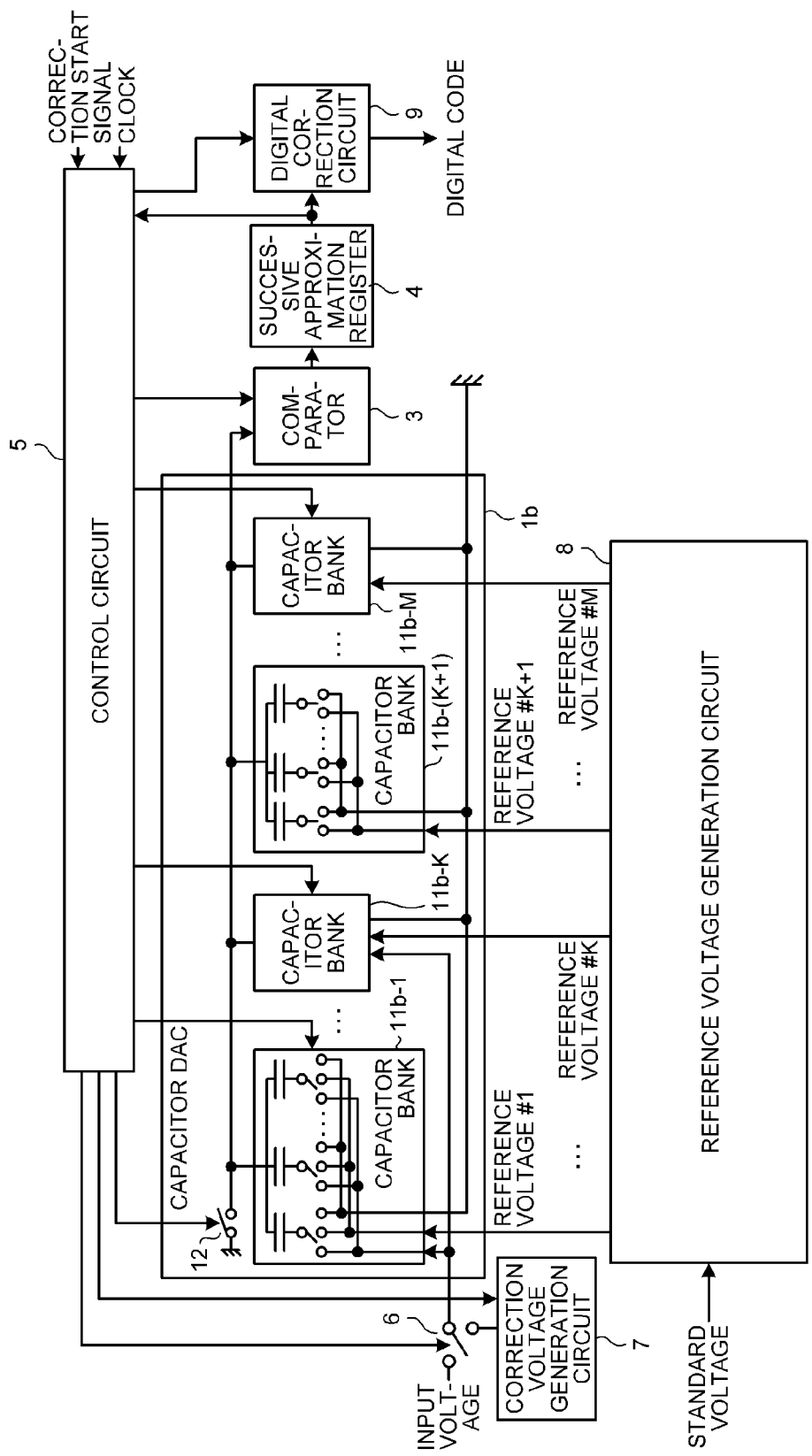
FIG. 20 illustrates a structure example of an AD conversion circuit according to a fifth embodiment.

FIG. 20 illustrates a structure example of an AD conversion circuit according to the fifth embodiment. The AD conversion circuit of this embodiment is similar to the AD conversion circuit of the first embodiment except that a reference voltage generation circuit 8 is provided instead of the voltage adjustment resistor DAC2, a capacitor DAC1*b* is provided instead of the capacitor DAC1, and a digital correction circuit 9 is added. The capacitor DAC1*b* includes the switch 12 and capacitor banks 11*b*-1 to 11*b*-M. The components having similar functions as those in the first embodiment are denoted with the same symbols as those in the first embodiment, and the description to such components is omitted.

In a successive approximation AD converter, generally, the capacitor is weighted with binary. In contrast, a method in which the capacitor is weighted with a weight that is not binary (hereinafter called non-binary weight) has also been proposed. In this method, with the redundancy obtained by using a non-binary value, the variation in capacitance can be corrected in a digital region.

Figure 21:
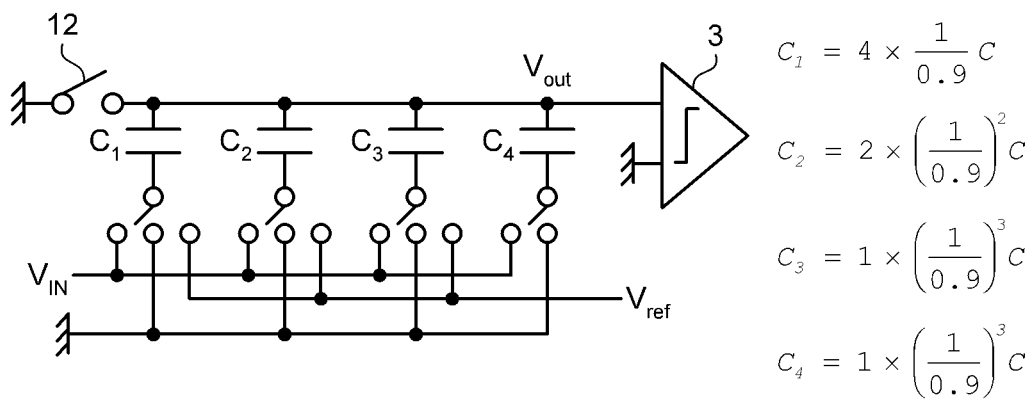
FIG. 21 illustrates a structure example of a capacitor DAC utilizing non-binary weight according to the comparative example.

FIG. 21 illustrates a structure example of a capacitor DAC using a non-binary weight in the comparative example. In this example, the reference voltage is single, and an example of three bits (actual data amount is $\log_2 (1.8^3)$) is shown for simplicity. The circuit structure is similar to that of the general successive approximation AD converter but the weight of the capacitor is not binary. The weight of the capacitor C1 used in the successive approximation of MSB is $4\times(0.9)^{-1}$. The weight of the capacitor C2 used in the bit that is one bit below the MSB is $2\times(0.9)^{-2}$. The weight of the capacitor C3 used in the bit that is two bits below the MSB is $1\times(0.9)^{-3}$. The capacitor C4 used in LSB is $1\times(0.9)^{-3}$. The operation of this circuit is similar to that of the general successive approximation AD converter. The output Vout of this circuit is obtained by the following formula (3), where D[2] to D[0] represent the digital codes obtained from the comparator (that is, the AD conversion results). The Vref represents the reference voltage.

$$V_{OUT} = \frac{8}{C_1 + C_2 + C_3 + C_4} \quad (3)$$

$$\left\{ \begin{array}{l} -V_{IN}\left(\frac{C_1+C_2+C_3+C_4}{8}\right) + \\ \left(\frac{1}{2\times 0.9}D[2] + \frac{1}{4\times 0.9^2}D[1] + \frac{1}{8\times 0.9^3}D[0]\right)V_{ref} \end{array} \right\}$$

Figure 22:
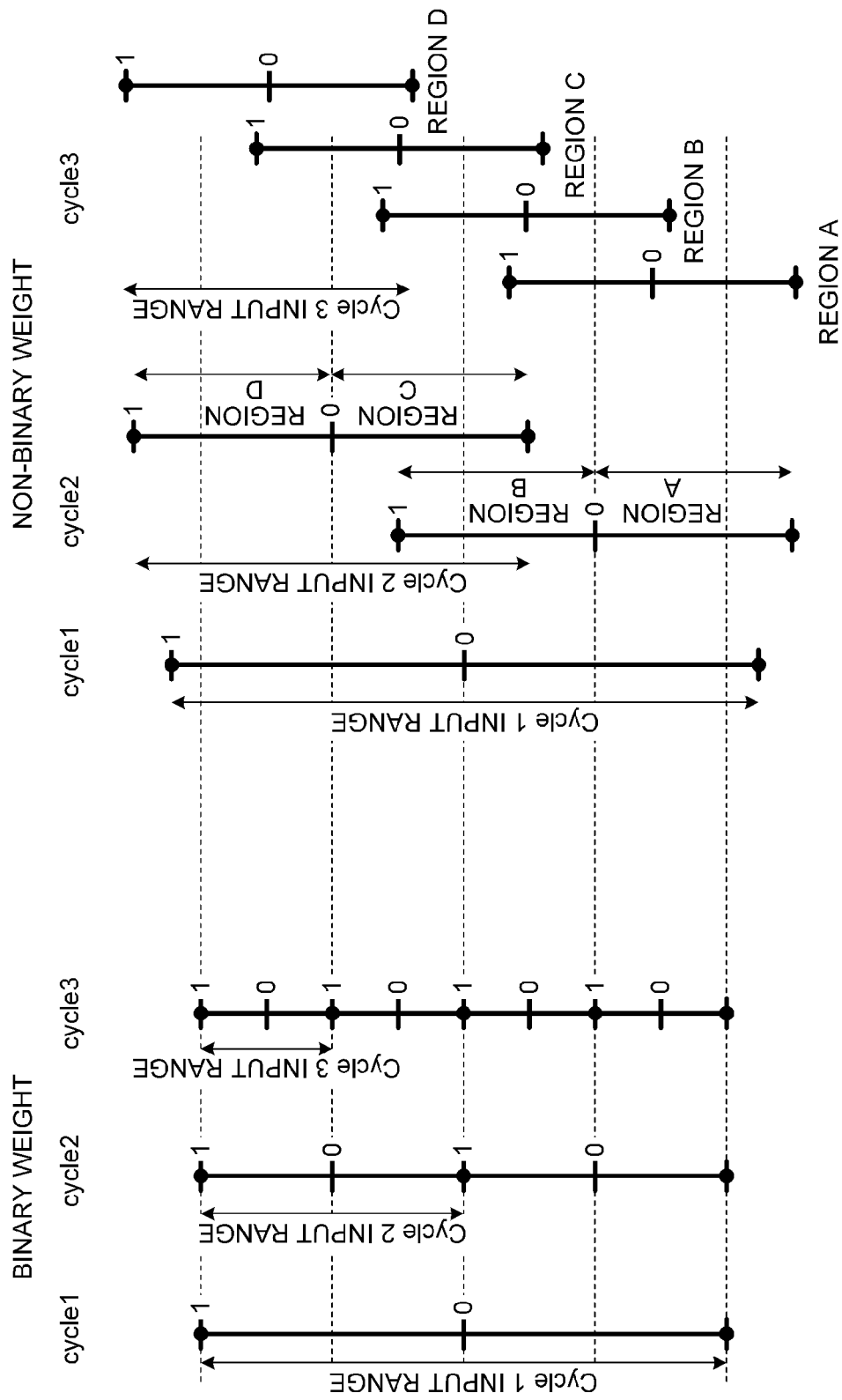
FIG. 22 schematically illustrates an input range of each cycle and successive approximation operation using non-binary weight according to the comparative example.

FIG. 22 schematically illustrates the input range of each cycle and the successive approximation operation using the non-binary weight in the comparative example in FIG. 21. The signal sampling is similar to that in the case of the binary weighting. In the successive approximation operation, cycle 1 is the conversion cycle of MSB, cycle 2 is the conversion cycle of the next (lower) bit, and cycle 3 is the conversion cycle of LSB. FIG. 22 indicates the input range corresponding to each cycle in the case of the binary weight on the right side and indicates the input range corresponding to each cycle in the case of a non-binary weight on the left side for comparison.

In the case of the non-binary weight indicated on the right side in FIG. 22, the analog output in a region A in cycle 2 is subjected to AD conversion using the lowest input range (for region A) in cycle 3. Similarly, analog signals in regions B, C, and D of cycle 2 are subjected to AD conversion using the input ranges for the region B, the region C, and the region D of cycle 3, respectively.

As is clear from FIG. 22, overlapping between the input ranges (overlap) is not generated in the AD conversion of the binary weight, whereas the overlapping is generated in the AD conversion of the non-binary weight.

Figure 23:
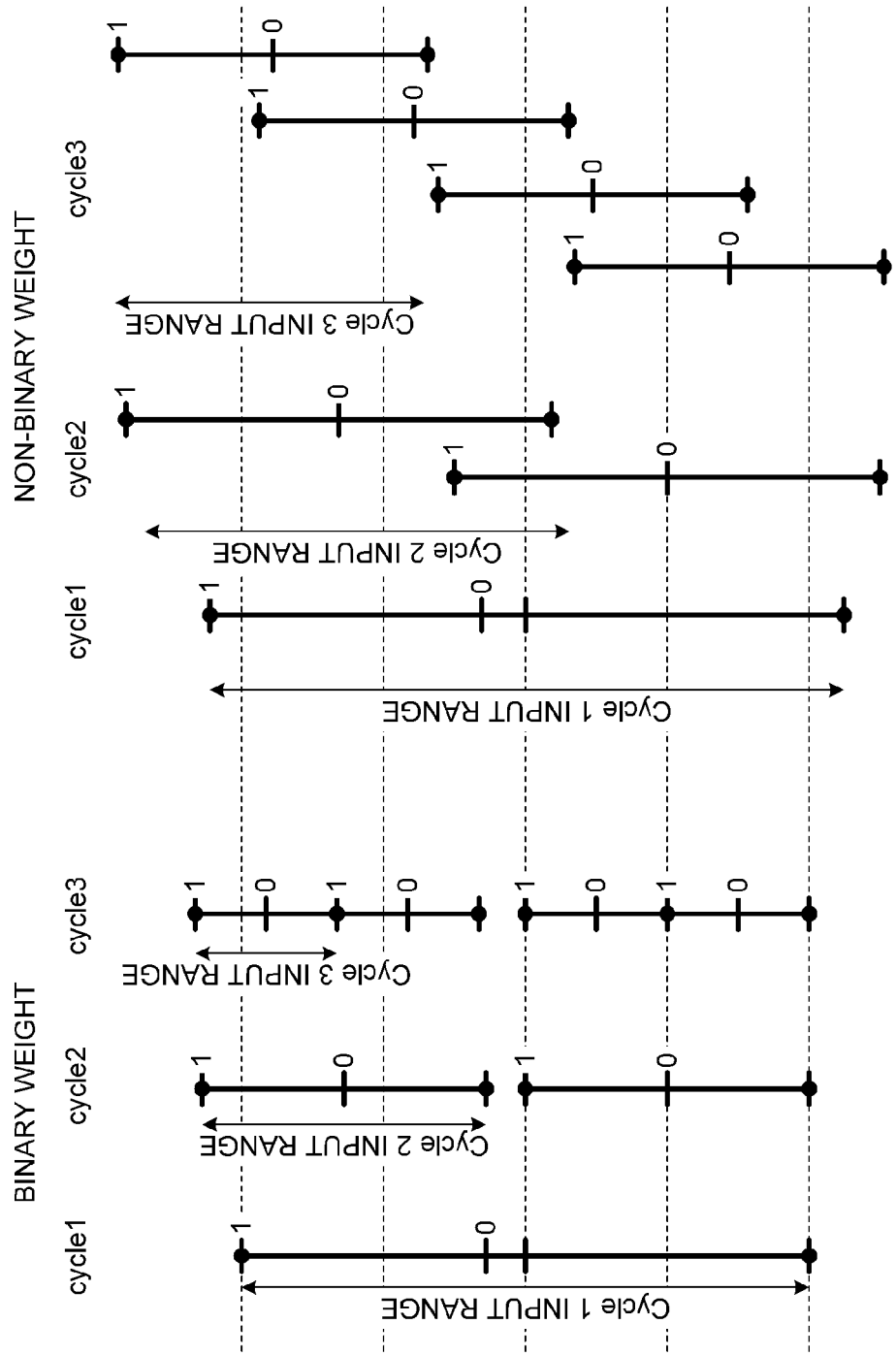
FIG. 23 schematically illustrates an input range of each cycle and successive approximation operation using non-binary weight when capacitance varies.

FIG. 23 schematically illustrates the input range of each cycle and the successive approximation operation using the non-binary weight in the case of variation in capacitance. In FIG. 23, on the premise of the example in which the capacitor DAC is used in the structure example of FIG. 21, the case in which the error is caused due to variation in capacitance C1 is assumed. When an error in capacitance is caused, the Vout follows the formula (4) as below. Note that a represents the error in capacitance due to the variation.

$$V_{OUT} = \frac{8}{C_1 + C_2 + C_3 + C_4} \quad (4)$$

$$\left\{ \begin{array}{l} -V_{IN}\left(\frac{C_1+C_2+C_3+C_4}{8}\right) + \\ \left(\frac{(1+\alpha)}{2\times 0.9}D[2] + \frac{1}{4\times 0.9^2}D[1] + \frac{1}{8\times 0.9^3}D[0]\right)V_{ref} \end{array} \right\}$$

As for $\alpha$, there are a positive error and a negative error. Here, description is made assuming that the positive error is caused. In this case, the threshold voltage of cycle 1 is displaced upward from the ideal value, as shown in FIG. 23. In the case of the AD conversion in the binary weighting system, a dead band is generated due to the displacement of the threshold voltage, which causes coding failure. Meanwhile, in the case of the AD conversion of the non-binary weight system, the dead band is not generated from the displacement of the threshold value because of the over-range of the lower bit. The AD conversion without a lack of data means the influence due to the threshold value variation can be corrected in a digital region. For example, it is clear from the above formula (4) that when the ideal input signal is given and the AD conversion is performed thereon, the difference between the ideal result and the actual result corresponds to the error due to the variation.

In the non-binary weight system, the variation in capacitance can be corrected in the range that does not exceed the over-range of the lower bit. Note that since the base is less than 2 in the non-binary weight system, the amount of data is smaller than that in the case where the base is 2, as aforementioned. Therefore, an extra AD conversion cycle is necessary in accordance with the setting of the base.

However, in this non-binary weight system of this comparative example, the redundancy is controlled by the weight of the capacitance; therefore, the capacitance value is large. As more sufficient redundancy is secured, the capacitance value becomes larger. Moreover, since the base is not 2, the base conversion needs to be performed in the digital region; therefore, the overhead of hardware is high.

In this embodiment, different from the non-binary weight system in the comparative example, the structure can be made of the capacitor with the weight of the power of two policy (binary weight) despite of the redundancy. The redundancy is given by making the value of the reference voltage to be supplied to each array larger than normal. In other words, the circuit structure of the capacitor DAC1$b$ can employ the successive approximation AD converter in a binary system as it is, and even though the error is caused due to the variation in capacitance, the redundancy is ensured so that the AD conversion is possible without a lack of data only by the adjustment of the reference voltage to be supplied to the capacitor DAC1$b$. Then, with the use of the AD conversion result, the error of the AD conversion result can be digitally corrected.

Figure 24:
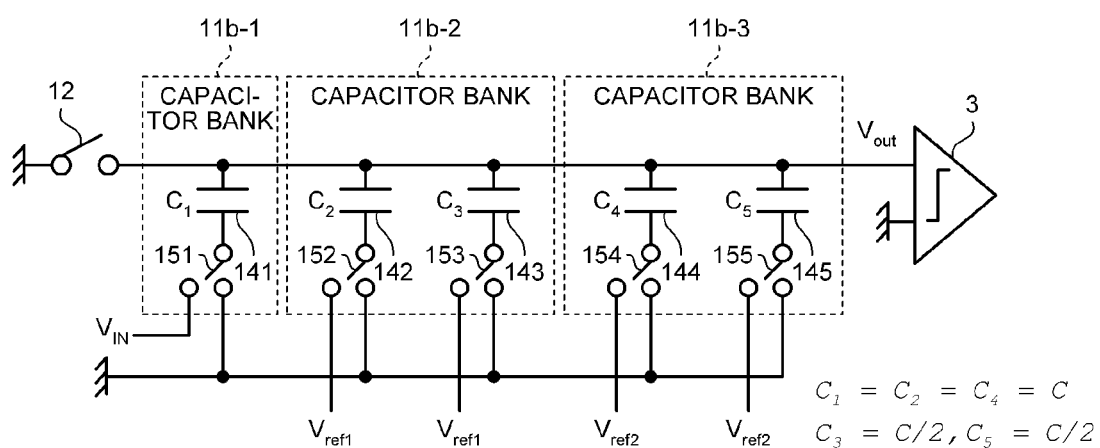
FIG. 24 illustrates a structure example of a capacitor DAC according to the fifth embodiment.

FIG. 24 illustrates a structure example of the capacitor DAC1$b$ of this embodiment. For simplifying the description, FIG. 24 illustrates a four-bit circuit. In the example of FIG. 24, the capacitor bank 11$b$-1 includes a capacitor 141 (capacitance value $C_1$) and a switch 151, the capacitor bank 11$b$-2 includes a capacitor 142 (capacitance value $C_2$), a capacitor 143 (capacitance value $C_3$), and switches 152 and 153, and the capacitor bank 11$b$-3 includes a capacitor 144 (capacitance value $C_4$), a capacitor 145 (capacitance $C_5$), and switches 154 and 155. $C_1=C_2=C_4=C$ and $C_3=C_5=C/2$. The reference voltage Vref1 is input to the capacitor bank 11$b$-2, and the reference voltage Vref2 is input to the capacitor bank 11$b$-3. Note that FIG. 24 illustrates the state in which the switch 6 is set so that an input signal Vin is input to the capacitor DAC1$b$, and the illustration of the switch 6 is omitted.

Figure 25A:
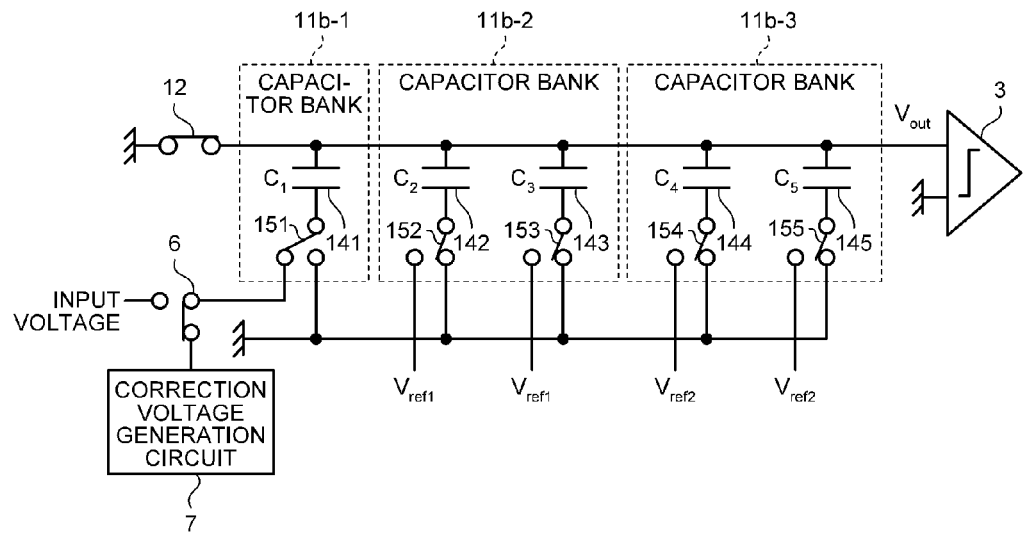
FIGS. 25A and 25B each illustrate an example of a circuit state in correction operation of the capacitor DAC according to the fifth embodiment.
Figure 25B:
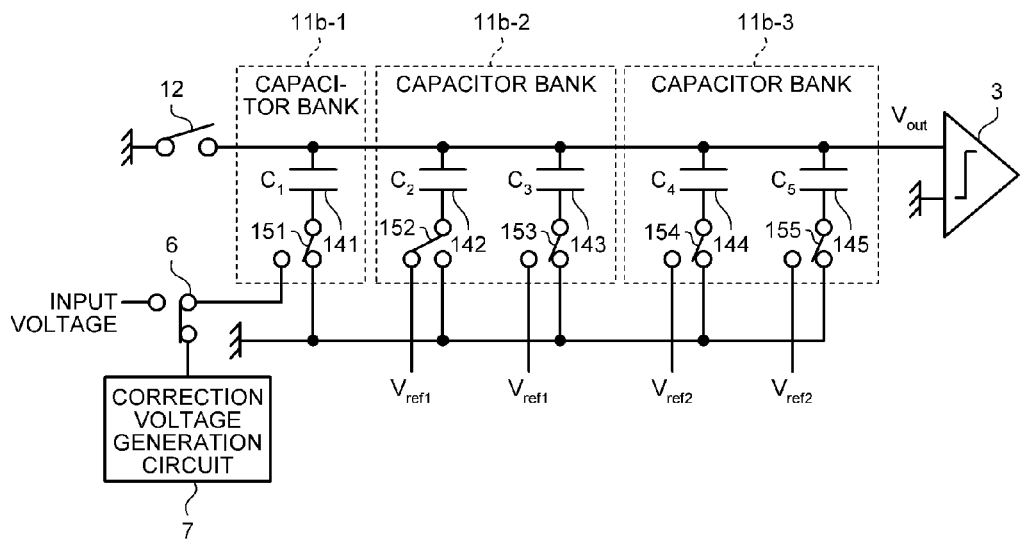

FIGS. 25A and 25B illustrate examples of the circuit state in the correction operation of the capacitor DAC1$b$ of this embodiment. FIGS. 25A and 25B are based on the circuit structure of FIG. 24. FIG. 25A illustrates the circuit state in the signal sampling mode, while FIG. 25B illustrates the circuit state in the successive approximation operation mode (MSB conversion cycle). In the correction operation, in a manner similar to the first embodiment, the control circuit 5 sets the switch 6 so that the correction voltage generation circuit 7 and the capacitor DAC1$b$ are connected to each other.

The correction voltage generation circuit 7 generates a known correction voltage. As illustrated in FIG. 25A, in the signal sampling mode, the capacitor bank 11$b$-1 has the capacitor 141 (capacitance value $C_1$) sample the input signal (correction voltage in this case). Therefore, one end of the capacitor 141 (capacitance value $C_1$) is connected to the correction voltage generation circuit 7, and one end of each of the capacitors 142 to 145 is grounded. A capacitor DAC output signal line (Vout in FIG. 25A) is also grounded.

In the successive approximation operation of FIG. 25B, one end of $C_1$ is grounded and one end of $C_2$ is connected to the reference voltage Vref1, so that Vout is in a floating state.

The Vout at this time is obtained by the following formula (5). Note that in the circuits of FIGS. 24 and 25, the capacitor 142 of the capacitor bank 11$b$-2 corresponds to MSB, the capacitor 143 of the capacitor bank 11$b$-2 corresponds to the bit that is one below MSB, the capacitor 144 of the capacitor bank 11$b$-3 corresponds to the bit that is two below MSB, and the capacitor 145 of the capacitor bank 11$b$-3 corresponds to LSB.

$$V_{OUT} = \frac{1}{4}\{-V_{IN} + V_{ref1}\} \quad (5)$$

The circuit of FIG. 24 performs the successive approximation operation of FIG. 25B for each bit until the LSB cycle to obtain the AD conversion result of four bits. The Vout is obtained by the following formula (6) where D[3] to D[0] are the AD conversion results in the cycles.

$$V_{OUT} = \frac{1}{4}\left\{-V_{IN} + D[3]V_{ref1} + \frac{1}{2}D[2]V_{ref1} + D[1]V_{ref2} + \frac{1}{2}D[0]V_{ref2}\right\} \quad (6)$$

Here, when Vref1=Vref/2 and Vref2=Vref/8, the above formula (6) becomes the following formula (7). This formula (7) means that the circuit of FIG. 24 can realize the binary type successive approximation operation.

$$V_{OUT} = \\ \frac{1}{4}\left\{-V_{IN} + \frac{1}{2}D[3]V_{ref} + \frac{1}{4}D[2]V_{ref} + \frac{1}{8}D[1]V_{ref} + \frac{1}{16}D[0]V_{ref}\right\} \quad (7)$$

In this embodiment, for performing digital correction, the capacitor bank 11$b$-2 is designed to have the over-range. The amount of the over-range corresponds to 1 LSB of the capacitor bank 11$b$-2. This can be achieved by using Vref/4 as the reference voltage Vref2 of the capacitor bank 11$b$-3.

Figure 26:
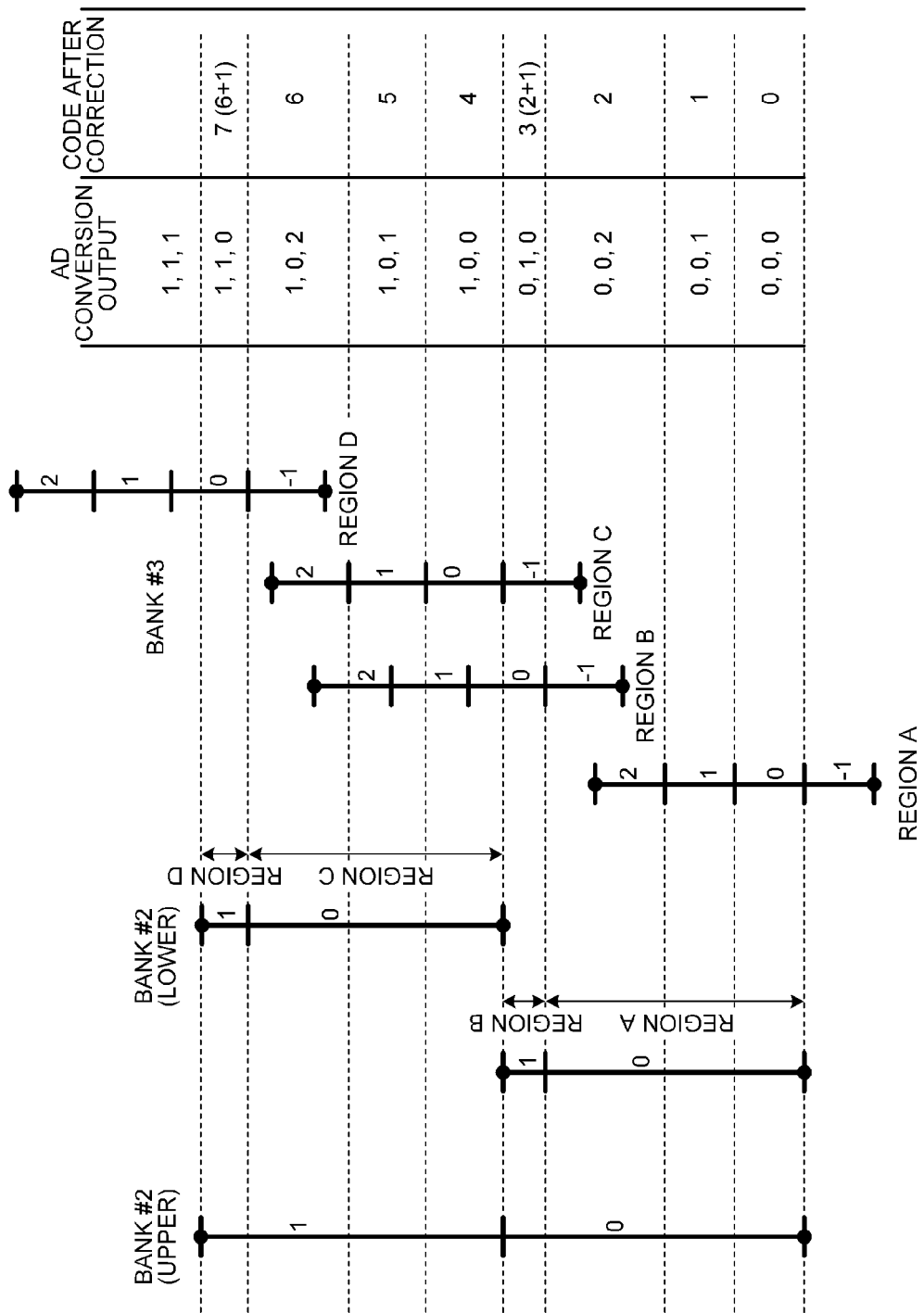
FIG. 26 schematically illustrates operation of the capacitor DAC according to the fifth embodiment (when there is an error in a plus direction)
Figure 27:
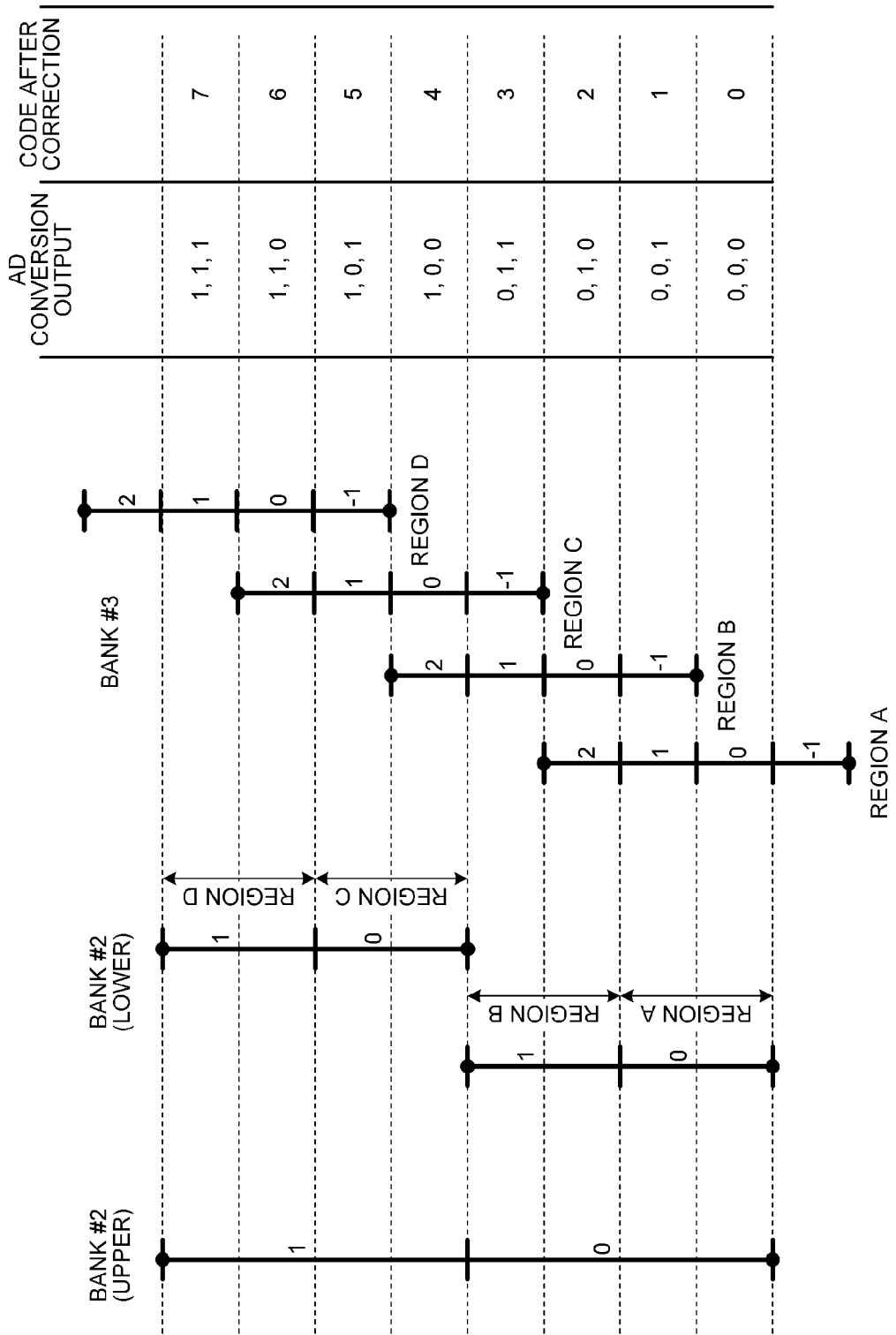
FIG. 27 schematically illustrates operation of the capacitor DAC according to the fifth embodiment (when there is no error)
Figure 28:
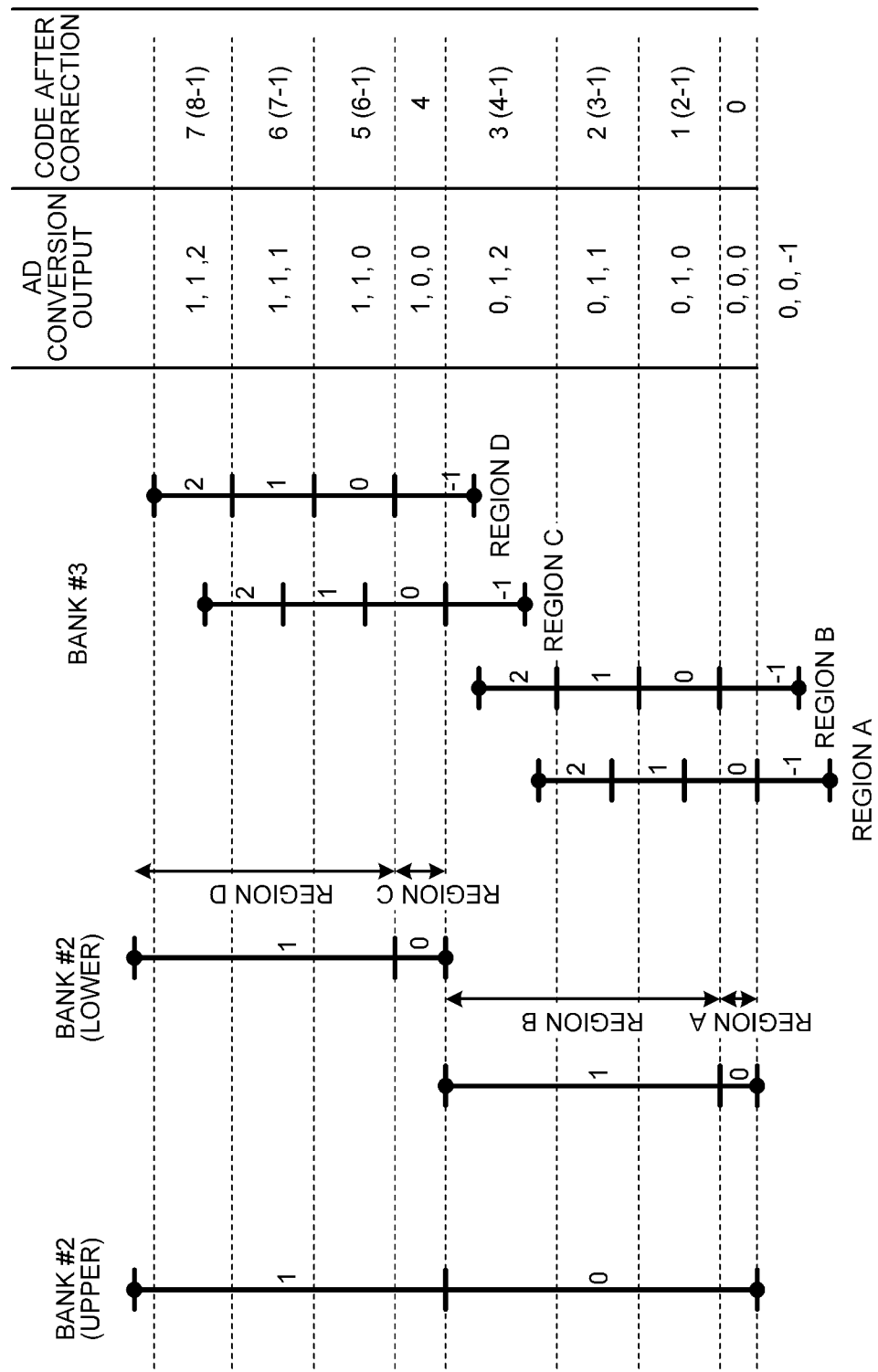
FIG. 28 schematically illustrates operation of the capacitor DAC according to the fifth embodiment (when there is an error in a minus direction)

FIGS. 26, 27, and 28 schematically illustrate the operation of the capacitor DAC1$b$ of this embodiment. In the following description of this embodiment, the capacitor bank 11$b$-$k$ (k=1, 2, 3) is abbreviated as the bank #k. In the example of FIG. 26, it is assumed that there is an error in a plus direction in threshold voltage of the capacitor (capacitor 143) that determines the lower bit of the bank #2 due to the variation in capacitance or the like. FIG. 27 schematically illustrates the operation of the capacitor DAC1$b$ of this embodiment when there is no error. In the example of FIG. 28, it is assumed that there is an error in a minus direction in threshold voltage of the capacitor (capacitor 143) that determines the lower bit of the bank #2.

In the example of FIG. 26, it is assumed that the capacitor (capacitor 143) that determines the lower bit of the bank #2 has an error due to variation in capacitance. Here, the error $\alpha$ represented by $C_3=(C/2)\times(1+\alpha)$ is assumed. In this case, the above formula (7) becomes the following formula (8).

$$V_{OUT} = \frac{1}{3.5 + \frac{1}{2}(1+\alpha)} \quad (8)$$

$$\left\{-V_{IN} + D[3]V_{ref1} + \frac{1+\alpha}{2}D[2]V_{ref1} + D[1]V_{ref2} + \frac{1}{2}D[0]V_{ref2}\right\}$$

The formula (8) indicates that the threshold voltage of the lower bit of the bank #2 is displaced from the ideal value. FIG. 26 illustrates the operation example when this displacement is 1.5×(Vref/8). As illustrated in FIG. 26, this error causes the threshold voltage to be displaced upward.

If the threshold voltage is displaced, the AD conversion output is as indicated in the right end of FIG. 26. Here, the representation of the AD conversion output (a, b, c) is as follows: a is the AD conversion output of the higher bit of the bank #2; b is the AD conversion output of the lower bit of the bank #2; and c is the AD conversion output (for two bits) of the bank #3. The weight of the digital value is obtained by multiplying the AD conversion output of the higher bit of the bank #2 by $2^2$, the AD conversion output of the lower bit of the bank #2 by $2^1$, and the AD conversion output of the bank #3 by $2^0$. In this example, a problem occurs in that the digital code (0, 1, 1) is lost as the AD conversion output due to the displacement of the threshold voltage. In this embodiment, the AD conversion output in the state including the error indicated in FIG. 26 is digitally corrected.

In the digital correction in this embodiment, the control circuit 5 obtains the difference between the AD conversion output and the ideal code as the correction value and passes the correction value to the digital correction circuit 9. Then, the digital correction circuit 9 stores the correction value and performs digital correction using the correction value in the normal AD conversion from the input voltage. For example, as illustrated in FIG. 26, it is assumed that the Vref1/4 is input as the correction voltage. In this example, since the threshold voltage of the lower bit of the bank #2 is shifted upward, the correction values becomes +1 LSB. Therefore, when the determination value of the lower bit of the bank #2 is "1", the correction is performed by adding the correction value "+1" to the AD conversion result in the case where the AD conversion output of the lower bit of the bank #2 is "1". The corrected code is shown in the right end of FIG. 26. In this manner, it is understood that the AD conversion is performed without code failure by adding the correction value "+1" to the AD converter output in accordance with the AD conversion result of the lower bit of the bank #2 as the correction target.

Moreover, as illustrated in FIG. 28, in the occurrence of an error of −1.5×(Vref/8) in threshold voltage, a problem occurs in that the digital code (0, 0, 1) is lost as the AD conversion output. In this example, in the case where the AD conversion output of the lower bit of the bank #2 is "1", the correction value "−1" is added to (that is, 1 is subtracted from) the AD conversion output, thereby performing the correction. This correction is performed by the digital correction circuit 9.

As for the correction value, when Vref1/4±Δ (Δ is the voltage sufficiently smaller than 1 LSB of the bank #3) is used as the correction voltage, for example, in the case of Vref1/4+Δ, (0, 1, 0) is output as the AD conversion result and in the case of Vref1/4−Δ, (0, 0, 1) is output as the AD conversion result as long as the threshold voltage is not displaced. The correction is not necessary as long as the ideal values are obtained as the AD conversion result from the input of the both Vref1/4±Δ. The correction value is obtained in the case where the AD conversion result and the ideal value are different in at least one of them from the input of Vref1/4±Δ.

As illustrated in FIG. 26, if the threshold voltage of the lower bit of the bank #2 is shifted to the plus side, (0, 0, 2) is output in the case of Vref1/4+Δ and (0, 0, 1) is output in the case of Vref1/4−Δ. On the contrary, if the threshold value is shifted to the minus side, (0, 1, 1) is output in the case of Vref1/4+Δ and (0, 1, 1) is output in the case of Vref1/4−Δ.

Therefore, when the lower bit AD conversion results of the bank #2 at the input of Vref1/4+Δ and Vref1/4−Δ are both 0, it can be assumed that the threshold voltage is displaced in the plus direction, in which the correction value is "(the AD conversion result of the bank #3 at the input of (Vref1/4+Δ)−1". When the lower bit AD conversion results of the bank #2 at the input of Vref1/4+Δ and Vref1/4−Δ are both 1, it can be assumed that the threshold voltage is displaced in the minus direction, in which the correction value is "0−(the AD conversion result of the bank #3 at the input of (Vref1/4−Δ))".

In this example, the correction value is obtained using the relation between the bank #2 and the bank #3; however, the correction value of any bank can be obtained by a similar method as long as the over-range is performed with the bank corresponding to one bit of the bits at and below the bit as the correction target. Note that since the appropriate correction value for obtaining the correction value is different depending on the bank as the correction target, the correction voltage generation circuit generates the voltage corresponding to the bit of the bank as the correction target.

The AD converter of this embodiment operates in two modes: (1) normal operation mode and (2) correction value measurement operation mode. In the normal mode, the control circuit 5 controls the switch 6 for inputting the input voltage to the capacitor DAC1b. Then, the digital correction circuit 9 performs the digital correction using the correction value obtained in the correction value measurement operation mode. The timing for performing the correction value measurement operation mode may be arbitrary; for example, the correction value measurement operation mode is performed when the AD converter is activated and the correction value is stored until the next correction value measurement operation mode is performed, and in the normal operation, the digital correction is performed using the stored correction value.

Note that the AD conversion result of the AD converter of this embodiment is based on the binary code system, and the correction value is also based on the binary code system. Therefore, different from the non-binary weight system as in the comparative example, the base conversion is not necessary and the digital correction can be achieved only by addition and subtraction; thus, the hardware can be easily configured.

Figure 29:
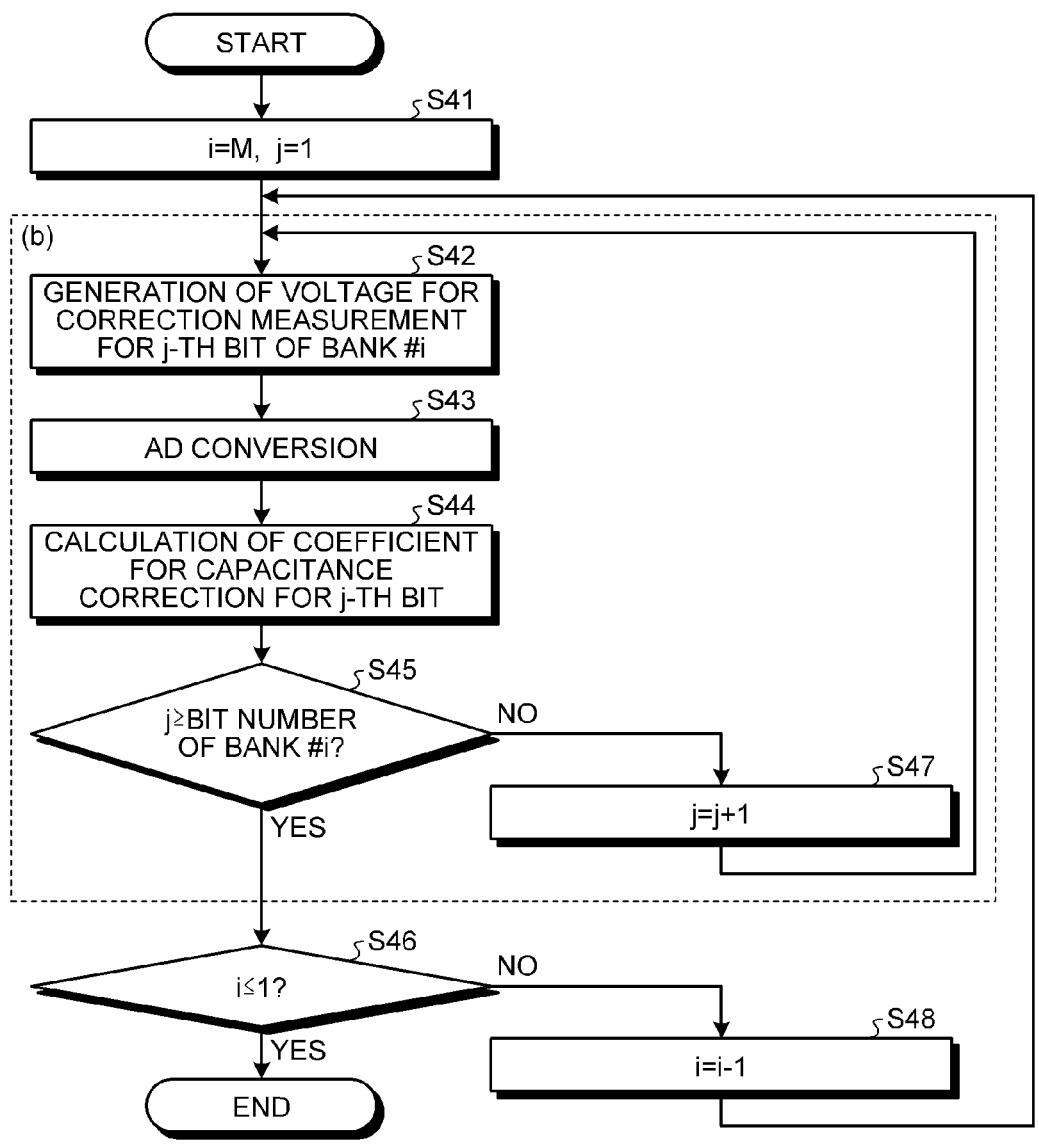
FIG. 29 illustrates an example of a procedure for calculating a correction value in the fifth embodiment for obtaining the correction value from a least significant bit.

FIG. 29 illustrates an example of the procedure for calculating the correction value of this embodiment in the case where the correction value is obtained from the lowest capacitor bank. As illustrated in FIG. 29, first, the control circuit 5 sets i=M and j=1 (Step S41). Note that as for the position of the capacitor denoted by j in the bank #i, when the first bit of the bank #i is defined as the highest one, the correction is performed in the order from the higher bit to the lower bit; when the first bit of the bank #i is defined as the lowest in the bank #i, the calculation order for the correction value is from the lower bit to the higher bit.

The control circuit 5 controls the correction voltage for the j-th bit of the bank #i for inputting to the capacitor DAC1b (Step S42), and AD conversion is performed (Step S43). Then, the correction value for the capacitor corresponding to the j-th bit of the bank #i is calculated (Step S44).

Next, the control circuit 5 determines whether j is the bit number of the bank #i or more (Step S45) and determines, when j is the bit number of the bank #i or more (Yes in Step S45), whether i is 1 or less (Step S46). When i is 1 or less (Yes in Step S46), the calculation processing for the correction value ends. When j is not the bit number of the bank #i or more in Step S45 (No in Step S45), the processing returns to Step S42 assuming that j=j+1 (Step S47). When i is not 1 or less in Step S46 (No in Step S46), the processing returns to Step S42 assuming that i=i−1 (Step S48).

Figure 30:
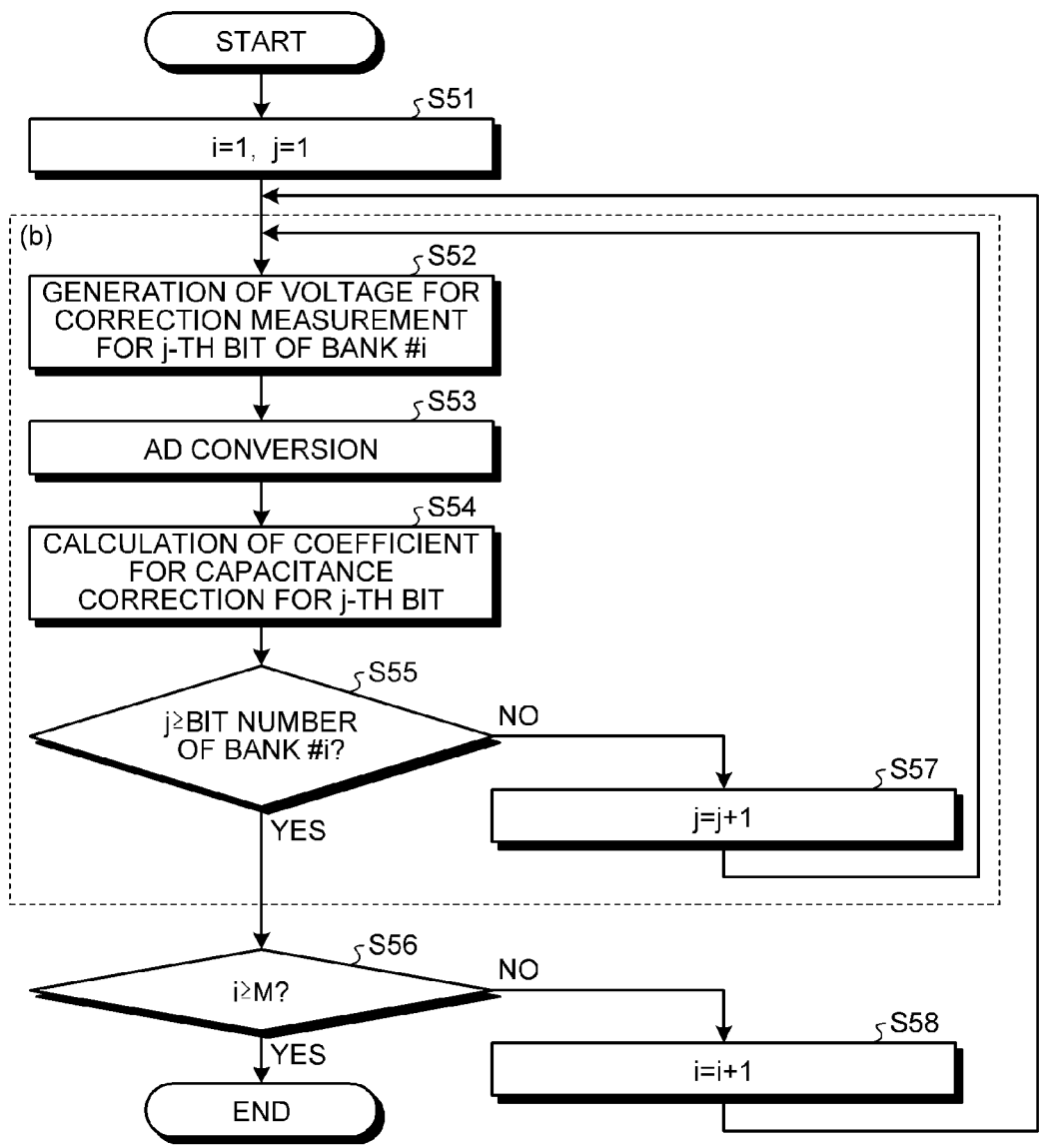
FIG. 30 illustrates an example of a procedure for calculating a correction value in the fifth embodiment for obtaining the correction value from a highest bit.

FIG. 30 illustrates an example of the procedure for calculating the correction value of this embodiment for obtaining the correction value from the uppermost capacitor bank. As illustrated in FIG. 30, first, the control circuit 5 sets i=1 and j=1 (Step S51). The correction voltage for the j-th bit of the bank #i is controlled for inputting to the capacitor DAC1*b* (Step S52), and the AD conversion is performed (Step S53). Then, the correction value for the capacitor corresponding to the j-th bit of the bank #i is calculated (Step S54).

Next, the control circuit 5 determines whether j is the bit number of the bank #i or more (Step S55) and when j is the bit (bit) number of the bank #i or more (Yes in Step S55), determines whether i is M or more (Step S56). When i is M or more (Yes in Step S56), the calculation processing for the correction value ends. When j is not the bit number of the bank #i or more (No in Step S55), the processing returns to Step S52 assuming that j=j+1 (Step S57). When i is not M or more in Step S56 (No in Step S56), the processing returns to Step S52 assuming that i=i+1 (Step S58).

Since the influence of the error of some lower bits including the least significant bit on the entire performance of the AD converter is sufficiently small, the correction may be omitted on some lower bits. Instead of the ground voltage indicated in FIG. 20, an appropriate voltage may be used. In the case of using a differential circuit, the same operation can be achieved without the ground voltage by connecting (short-circuiting) terminals corresponding to the ground voltage of each circuit.

In this embodiment, the AD conversion results are corrected through digital correction; however, the digital correction may be replaced by adjustment of a capacitance value itself of the capacitor based on the AD conversion result in the case of using the correction voltage in a manner similar to the correction of the reference voltage of the first embodiment.

Thus, in this embodiment, the capacitor DAC is formed with the binary weight and the input ranges are overlapped by adjusting the reference voltage, thereby providing the redundancy. Then, the correction value for performing the digital correction is obtained based on the AD conversion result in the case of inputting the known correction voltage, and the digital correction is performed using this correction value in normal AD conversion. Accordingly, the error of the AD conversion result due to the displacement of threshold voltage can be reduced while the capacitor DAC is formed with the binary weight. Moreover, since the weight of the capacitor does not have to be changed, the circuit area of the capacitor DAC can be reduced.

SIXTH EMBODIMENT

Figure 31:
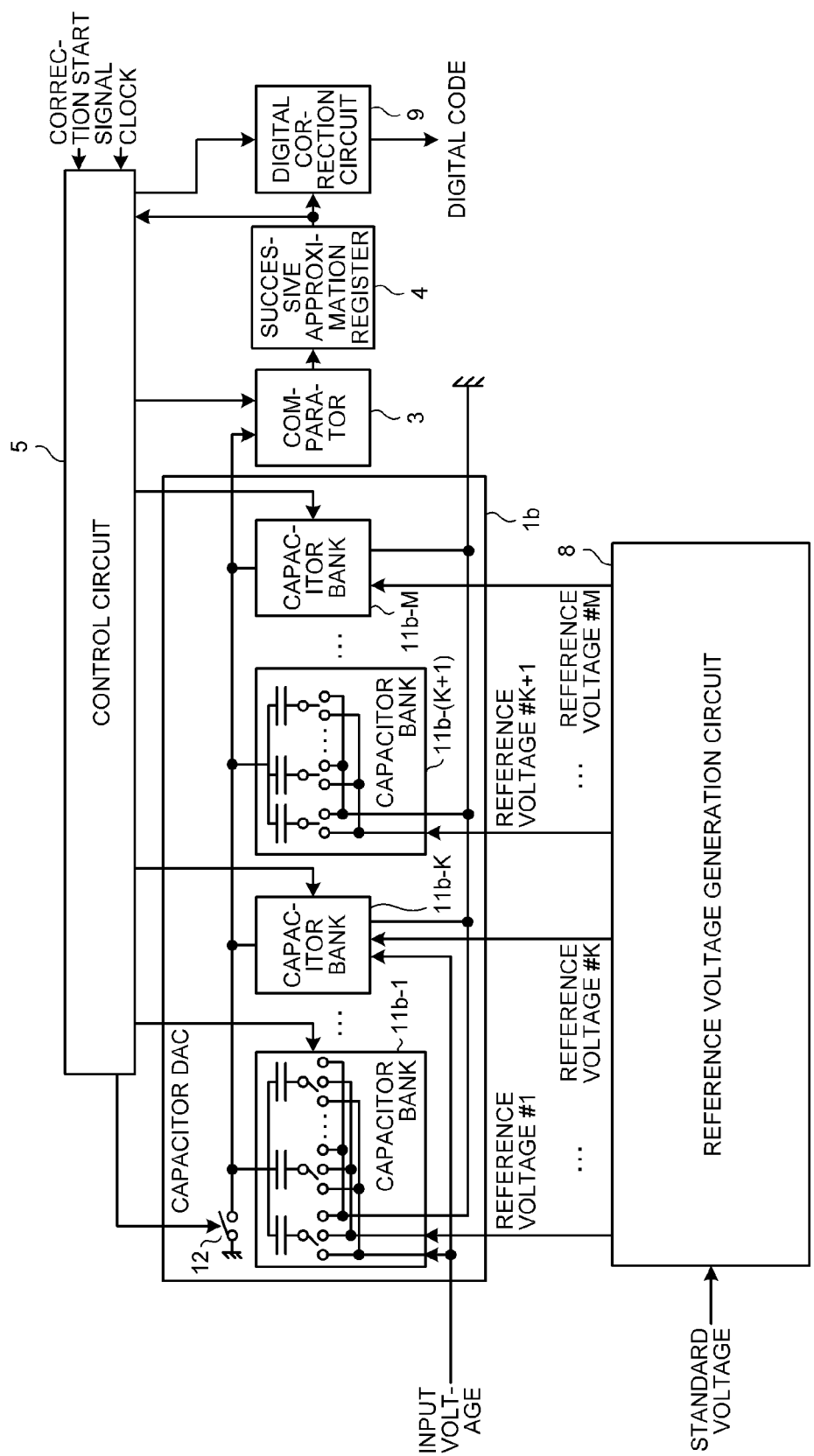
FIG. 31 illustrates a structure example of an AD conversion circuit according to a sixth embodiment.

FIG. 31 illustrates a structure example of an AD conversion circuit according to the sixth embodiment. The AD converter according to this embodiment is similar to that of the fifth embodiment except that the correction voltage generation circuit 7 is eliminated from the AD converter according to the fifth embodiment. The components having similar functions as those in the fifth embodiment are denoted with the same symbols as those in the fifth embodiment, and the description to such components is omitted.

In this embodiment, the voltage for measuring the correction value that is used instead of the correction voltage is generated by the capacitor DAC1*b* itself.

Figure 32A:
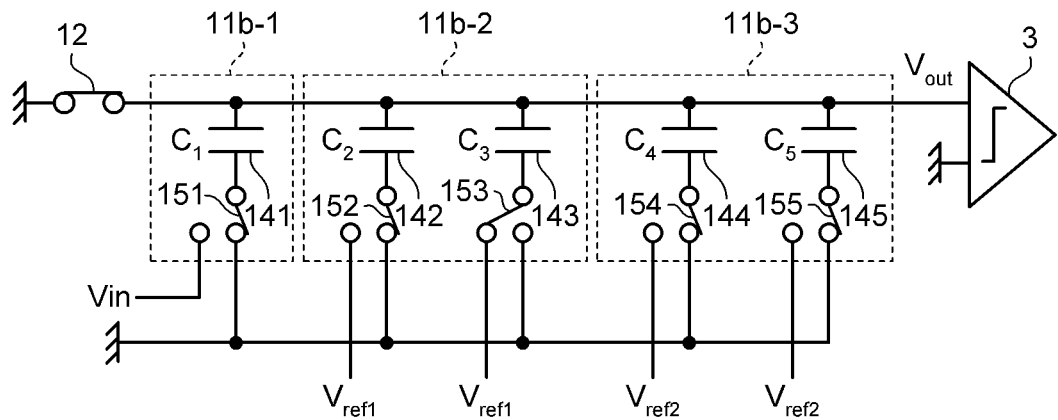
FIGS. 32A and 32B each illustrate an example of operation for calculating a correction value of a capacitor DAC according to the sixth embodiment.
Figure 32B:
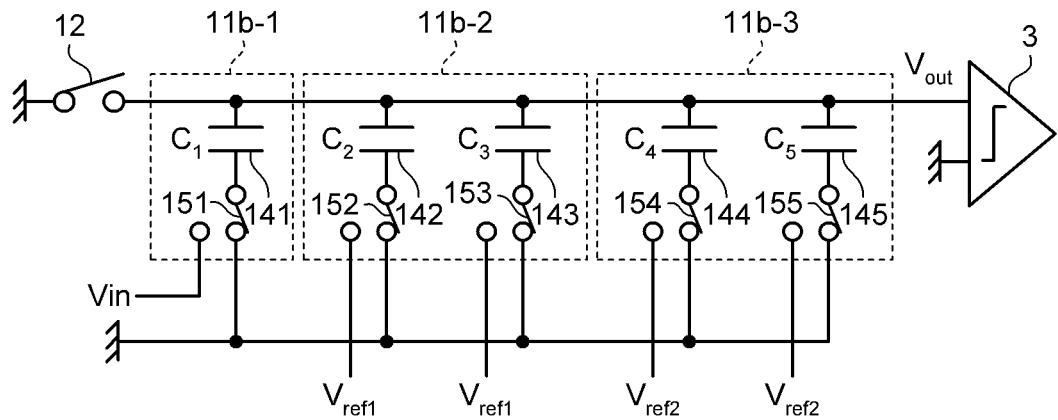

FIGS. 32A and 32B illustrate an operation example for calculating the correction value of the capacitor DAC1*b* of this embodiment. In FIGS. 32A and 32B, the structure illustrated in FIG. 24 of the fifth embodiment is assumed as the circuit structure example of the capacitor DAC1*b*.

FIG. 32A illustrates an example of the circuit state in a sampling mode for obtaining the correction value, while FIG. 32B illustrates an example of the circuit state in a holding operation mode. Here, in the example, the correction value of the capacitor 143 is obtained with the capacitor 143 ($C_3$) as the correction target. In FIG. 32A, one end of each of the capacitors 141, 142, 144, and 145 is grounded. A reference voltage Vref1(=Vref/2) is input to the capacitor 143.

In the holding operation mode of FIG. 32B, one end of each of the capacitors 141 to 145 is grounded with the switch 12 opened while the node connected to the comparator 3 is set in a floating state. The Vout at this time is obtained from the following formula (9).

$$V_{OUT} = \frac{1}{3.5 + \frac{1}{2}(1+\alpha)} \left\{ \frac{1+\alpha}{4} V_{ref} \right\} \qquad (9)$$

The formula (9) indicates that the output voltage in the holding operation mode is exactly the threshold voltage of the lower bit of the bank #2. Note that α is the error of the capacitor 143 due to the variation in capacitance or the like.

Figure 33:
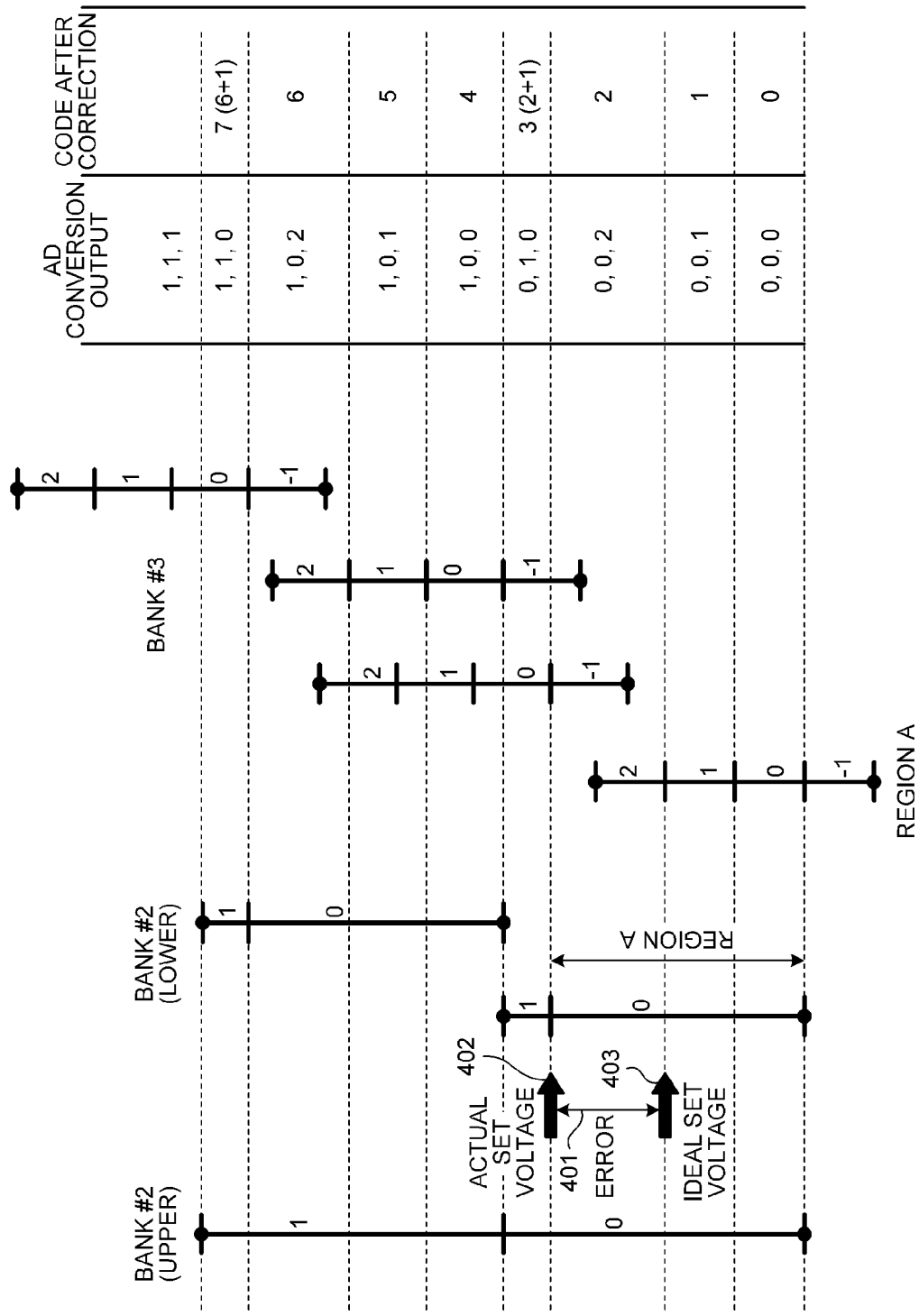
FIG. 33 schematically illustrates the operation according to the sixth embodiment.

FIG. 33 schematically illustrates the operation of this embodiment. In FIG. 33, the output voltage in the holding operation is the set voltage, and an actual set voltage 402 is indicated in the case where there is an error 401 from an ideal set voltage 403. In the following description of this embodiment, the capacitor bank 11*b*-*k* (k=1, 2, 3) is abbreviated as the bank #k. The measurement of the correction value corresponding to each capacitor of the capacitor DAC1*b* of this embodiment is obtained from the difference between the ideal value and the conversion result obtained by the AD conversion of the voltage set in the holding operation mode using the bank #3.

When the AD conversion result is output, the output result of the lower bit of the bank #2 is set at "0". In this case, the position of the actual set voltage 402 is over the input range for the region A of the bank #3; however, in such a case, it is assumed that the voltage is over the highest threshold voltage and therefore determined as "2". Accordingly, the AD conversion result of this case is (0, 0, 2). In this example, the ideal value (ideal code) is (0, 0, 1), and based on the difference between the ideal value and the actual AD conversion result, the error is 1 LSB. Therefore, in a manner similar to the fifth embodiment, the correction into the ideal output code is possible by using +1 as the correction value when the lower bit of the bank #2 is output as "1".

When the threshold voltage of the lower bit of the bank #2 is displaced by 1 LSB toward a minus side, the AD conversion result is (0, 0, 0). The difference between the ideal value and the actual AD conversion result is −1 LSB, and this is the correction value. The operation of the digital correction except for the aforementioned operation is similar to that of the fifth embodiment.

Figure 34:
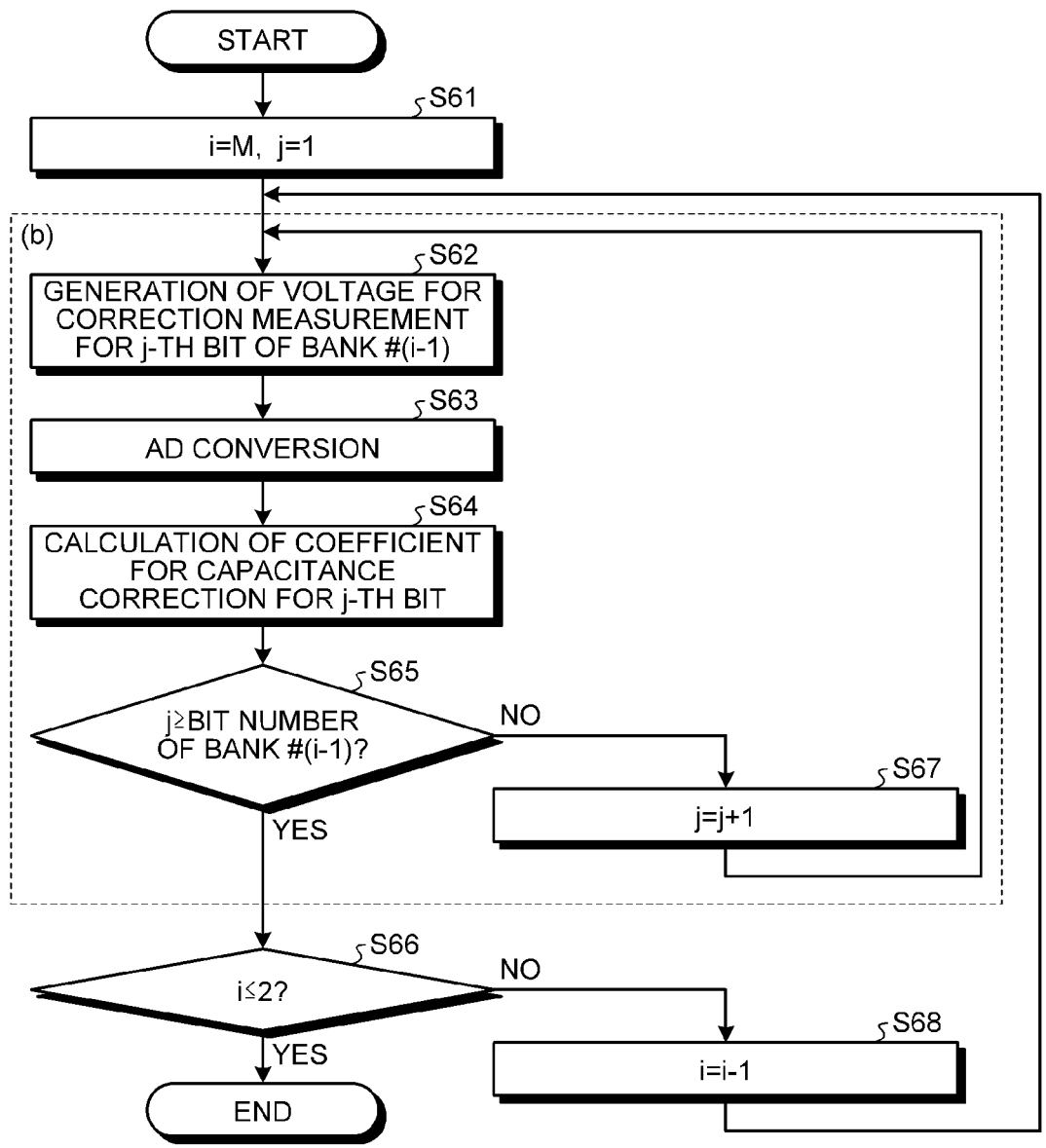
FIG. 34 illustrates an example of a procedure for calculating a correction value in the sixth embodiment for obtaining the correction value from the least significant bit.

FIG. 34 illustrates an example of the procedure for calculating the correction value of this embodiment for obtaining the correction value from the least significant bit. As illustrated in FIG. 34, first, the control circuit 5 sets i=M and j=1 (Step S61).

Next, the control circuit 5 controls the correction voltage (set voltage) for the j-th bit of the bank #(i−1) for inputting to the capacitor DAC1*b* (Step S62) and the AD conversion is performed (Step S63). Then, the correction value for the capacitor corresponding to the j-th bit of the bank #(i−1) is calculated (Step S64).

Next, the control circuit 5 determines whether j is the bit number of the bank #(i−1) or more (Step S65), and when j is the bit number of the bank #i or more (Yes in Step S65), determines whether i is 2 or less (Step S66). When i is 2 or less (Yes in Step S66), the calculation processing for the correction value ends. When j is not the bit number of the bank #i or more in Step S65 (No in Step S65), the processing returns to Step S62 assuming that j=j+1 (Step S67). When i is not 2 or less in Step S66 (No in Step S66), the processing returns to Step S62 assuming that i=i−1 (Step S68).

Figure 35:
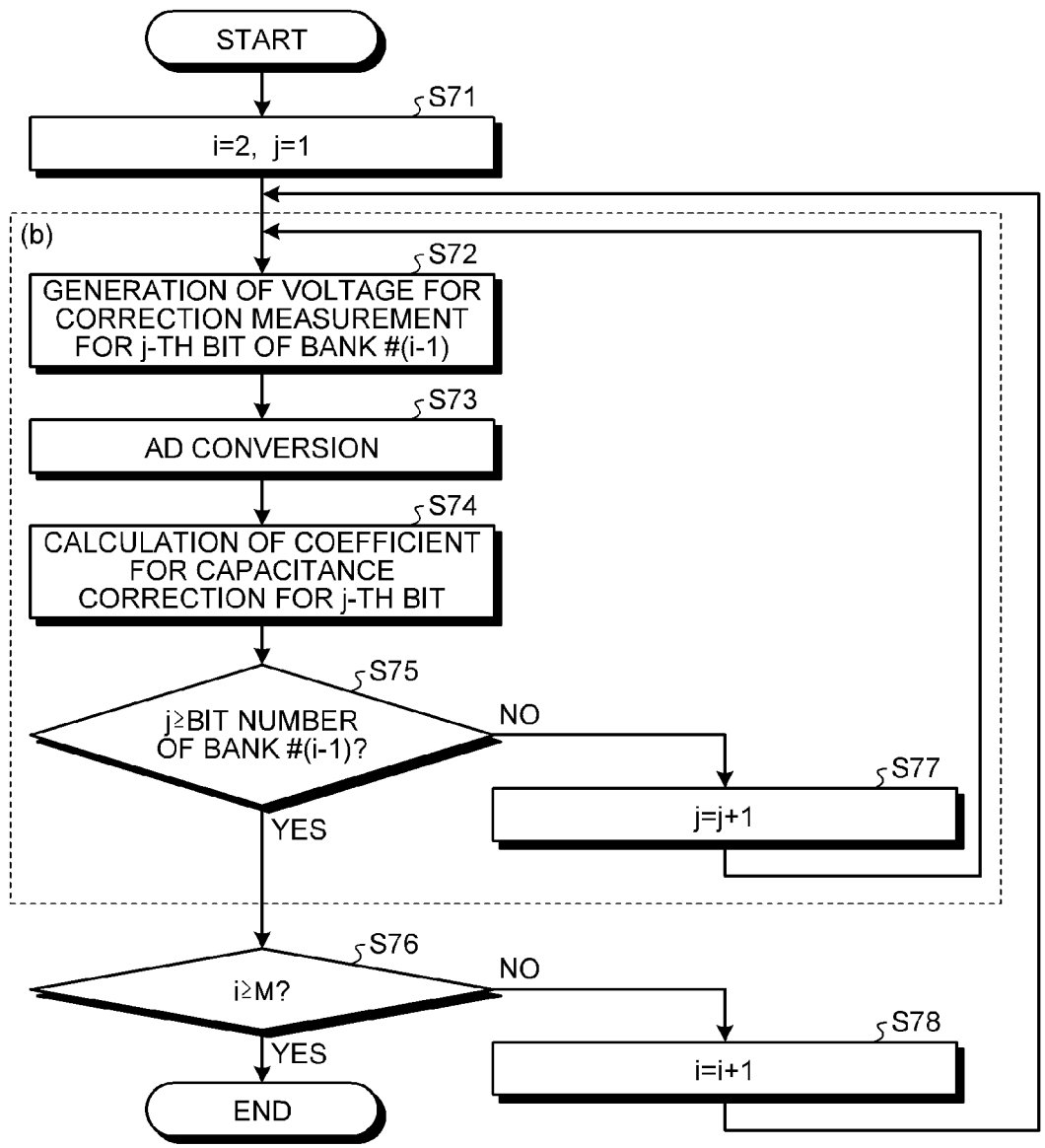
FIG. 35 illustrates an example of a procedure for calculating a correction value in the sixth embodiment for obtaining the correction value from the highest bit.

FIG. 35 illustrates an example of the procedure for calculating the correction value of this embodiment for obtaining the correction value from the highest bit. As illustrated in FIG. 35, first, the control circuit 5 sets i=2 and j=1 (Step S71). The control is performed (Step S72) so that the correction voltage (set voltage) for the j-th bit of the bank #(i−1) is input to the capacitor DAC1b and the AD conversion is performed (Step S73). Then, the correction value for the capacitor corresponding to the j-th bit of the bank #(i−1) is calculated (Step S74).

Next, the control circuit 5 determines whether j is the bit number of the bank #i or more (Step S75), and when j is the bit number of the bank #i or more (Yes in Step S75), determines whether i is M or more (Step S76). When i is M or more (Yes in Step S76), the calculation processing for the correction value ends. When j is not the bit number of the bank #(i−1) or more (No in Step S75), the processing returns to Step S72 assuming that j=j+1 (Step S77). When i is not M or more in Step S76 (No in Step S76), the processing returns to Step S72 assuming that i=i+1 (Step S78).

In this manner, because generation of a special signal for measurement of the correction value is not necessary in this embodiment, the circuit area can be reduced as compared with the fifth embodiment.

SEVENTH EMBODIMENT

Figure 36:
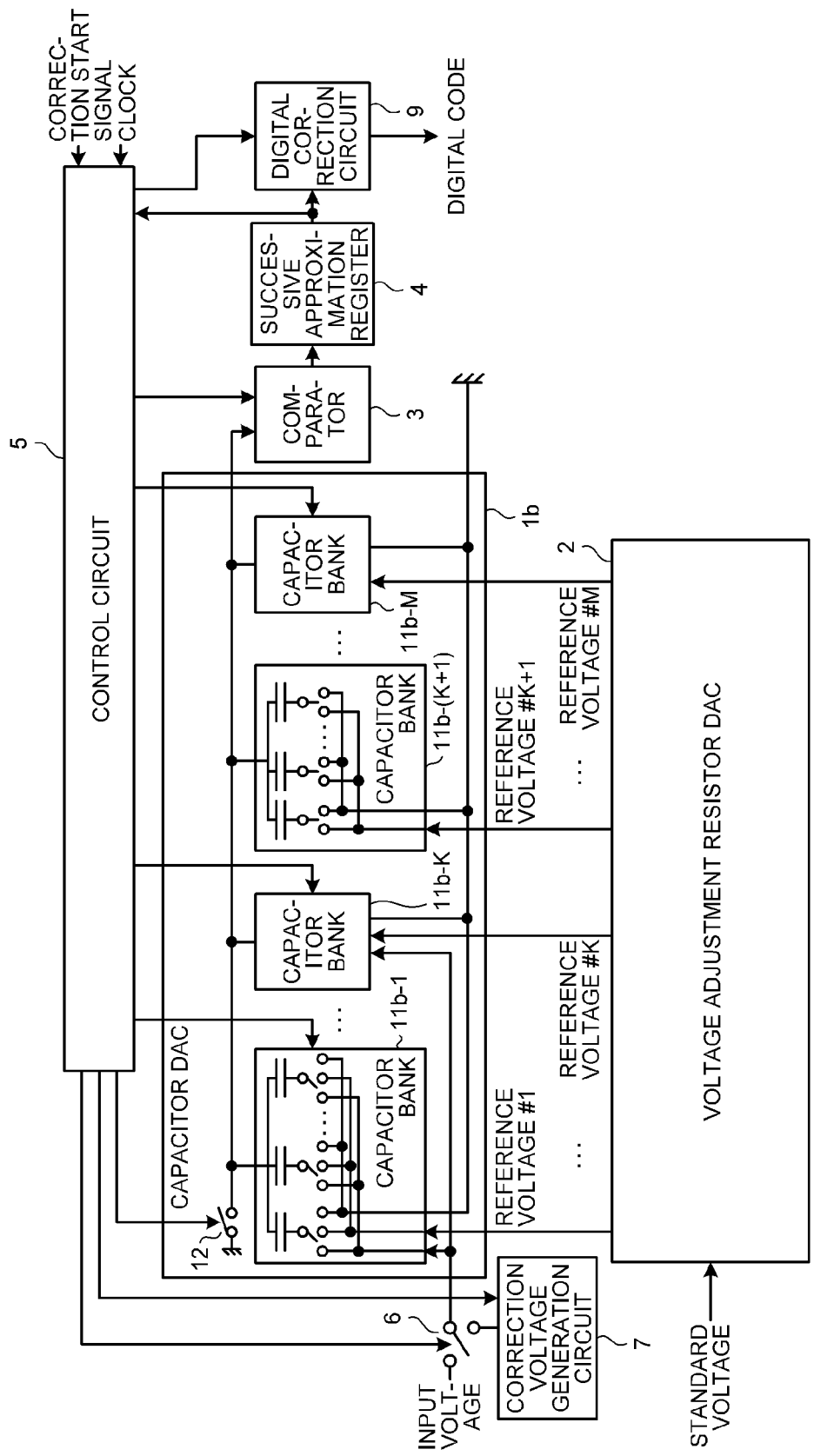
FIG. 36 illustrates a structure example of an AD conversion circuit according to a seventh embodiment.

FIG. 36 illustrates a structure example of an AD conversion circuit according to the seventh embodiment. The AD converter according to this embodiment is similar to that of the fifth embodiment except that the voltage adjustment resistor DAC2 of the first embodiment is provided instead of the reference voltage generation circuit 8 of the AD converter of the fifth embodiment. The components having similar functions as those in the fifth embodiment and the first embodiment are denoted with the same symbols as those in the fifth embodiment and the first embodiment, and the description to such components is omitted.

The AD converter according to this embodiment uses a plurality of reference voltages. As described in the first embodiment, the generation of variation in the reference voltages causes the error of the AD converter. A method of correcting the error due to the variation in reference voltage is similar to that of the first embodiment.

Figure 37:
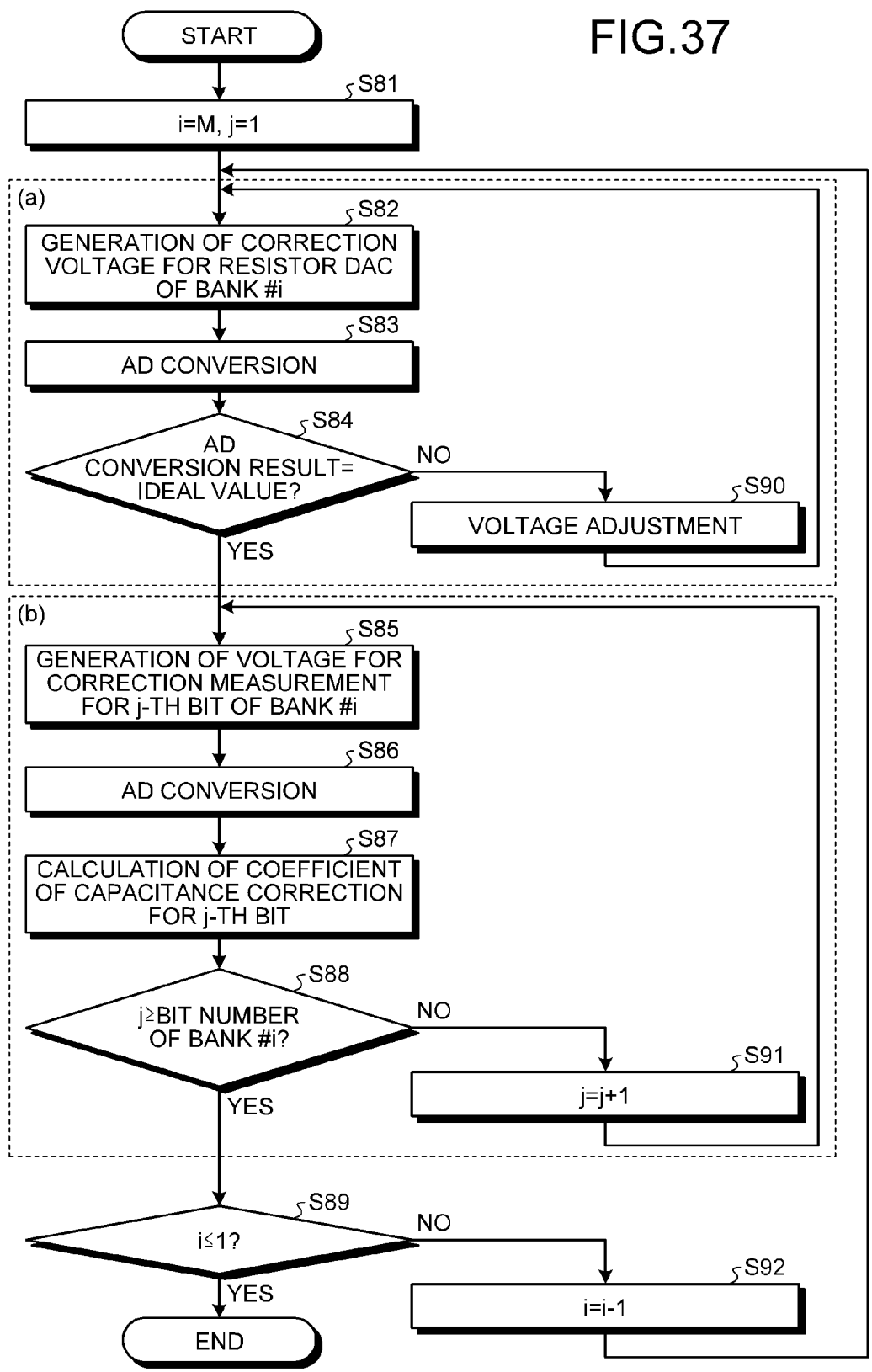
FIG. 37 illustrates an example of a procedure for correction processing according to the seventh embodiment.

In this embodiment, both the correction of the error due to the variation in reference voltage and the correction of the error due to the variation in capacitance, which is similar to that of the fifth embodiment, are carried out. FIG. 37 illustrates an example of the procedure for correction processing of this embodiment. The correction processing of this embodiment includes the following two: one is the resistor DAC correction (portion surrounded by a square denoted with (a) in FIG. 37) for correcting the error due to the variation in reference voltage; the other is the capacitor DAC correction (portion surrounded by a square denoted with (b) in FIG. 37) for obtaining the correction value for the error due to the variation in capacitance.

As illustrated in FIG. 37, first, the control circuit 5 sets i=M and j=1 (Step S81). Note that the capacitor bank 11b-1 (bank #1) corresponds to MSB and the bank 11-M (bank #M) corresponds to LSB (Least Significant Bit).

The control circuit 5 controls the correction voltage for inputting to the capacitor DAC1b (Step S82) and the AD conversion is performed using the bank #i and the subsequent banks (banks corresponding to the bits at and below the bit corresponding to the bank #i) (Step S83). Then, the control circuit 5 determines whether the AD conversion result is correct or not (Step S84).

When the AD conversion result is correct (Yes in Step S84), the control circuit 5 controls the correction voltage for the j-th bit of the bank #i for inputting to the capacitor DAC1b (Step S85), and the AD conversion is performed (Step S86). Then, the correction value for the capacitor corresponding to the j-th bit of the bank #i is calculated (Step S87).

Next, the control circuit 5 determines whether j is the bit number of the bank #i or more (Step S88), and when j is the bit number of the bank #i or more (Yes in Step S88), determines whether i is 1 or less (Step S89). When i is 1 or less (Yes in Step S89), the calculation processing for the correction value ends.

When the AD conversion result is not correct in Step S84 (No in Step S84), the reference voltage is adjusted (Step 90) and the processing returns to Step S82. When j is not the bit number of the bank #i or more in Step S88 (No in Step S88), the processing returns to Step S85 assuming that j=j+1 (Step S91). When i is not 1 or less in Step S89 (No in Step S89), the processing returns to Step S82 assuming that i=i−1 (Step S92).

Although the correction processing is performed from the lower bit here, the correction processing may be performed from the higher bit as described in the fifth embodiment and the first embodiment, and the processing procedure is not limited to the example of FIG. 37.

As thus described, in this embodiment, both the correction of the error due to the variation in capacitance and the correction of the error due to the variation in reference voltage are performed. Therefore, as compared with the case in which only one of them is corrected, the error of the AD conversion result can be reduced further.

EIGHTH EMBODIMENT

Figure 38:
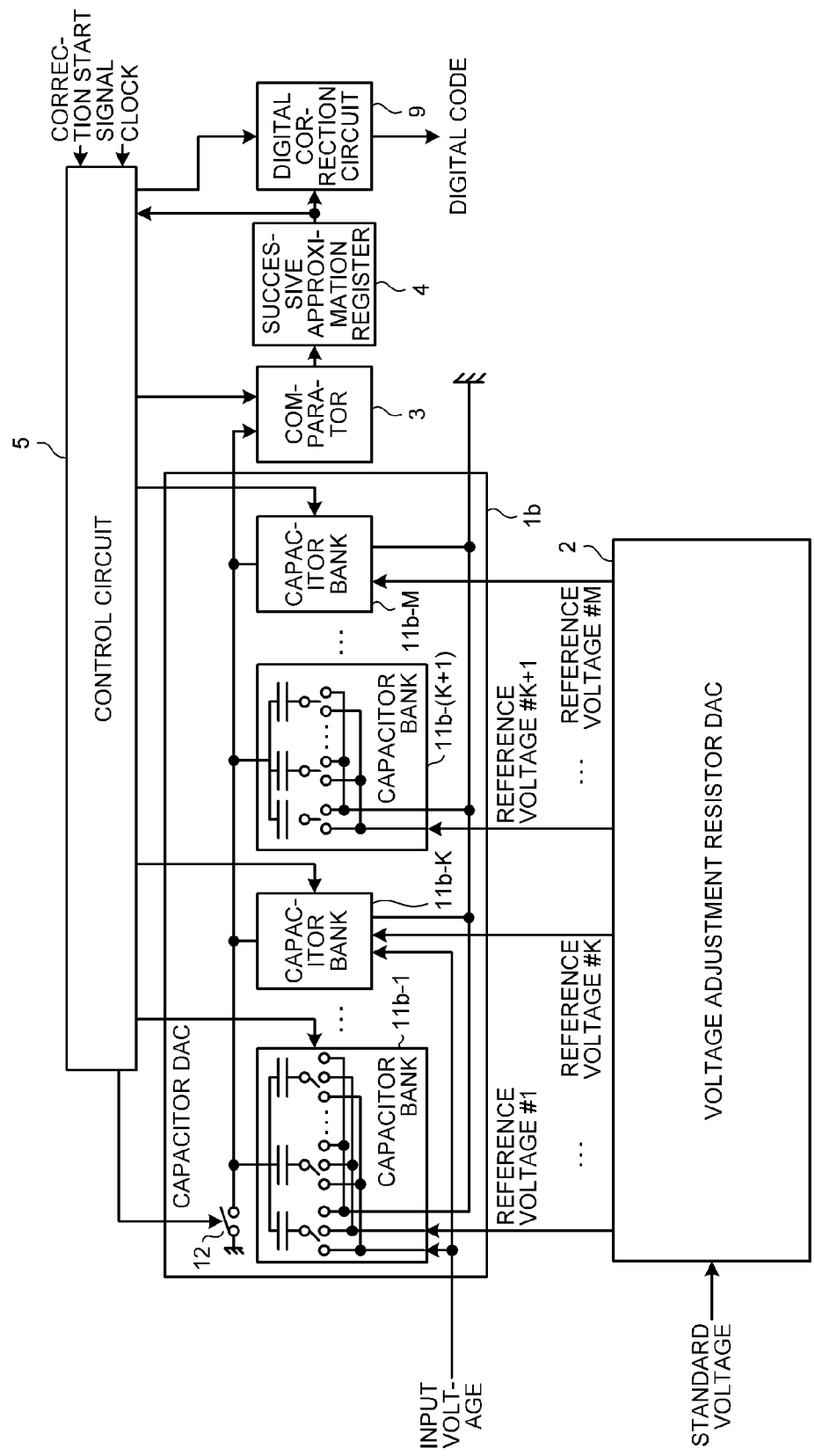
FIG. 38 illustrates a structure example of an AD conversion circuit according to an eighth embodiment.

FIG. 38 illustrates a structure example of an AD conversion circuit according to the eighth embodiment. The AD converter according to this embodiment is similar to that of the sixth embodiment except that the voltage adjustment resistor DAC2 of the second embodiment is provided instead of the reference voltage generation circuit 8 of the AD converter of the sixth embodiment. The components having similar functions as those in the sixth embodiment and the second embodiment are denoted with the same symbols as those in the sixth embodiment and the second embodiment, and the description to such components is omitted.

Figure 39:
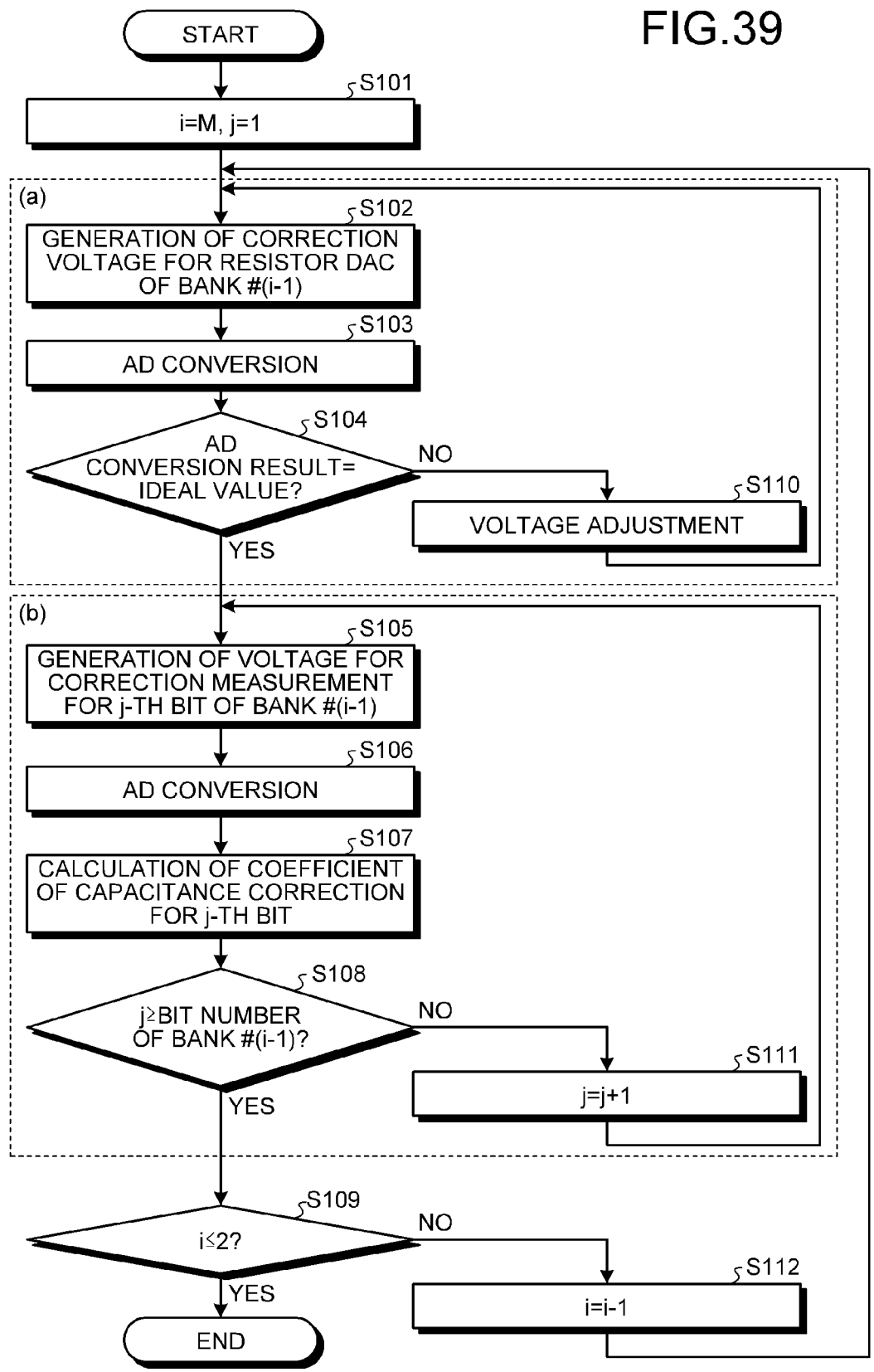
FIG. 39 illustrates an example of a procedure for correction processing according to the eighth embodiment.

In this embodiment, the correction of the error due to the variation in reference voltage is performed by a method similar to that of the second embodiment and the correction of the error due to the variation in capacitance similar to that of the sixth embodiment is performed. FIG. 39 illustrates an example of the procedure for the correction processing of this embodiment. The correction processing of this embodiment includes the following two: one is the resistor DAC correction (portion surrounded by a square denoted with (a) in FIG. 39) for correcting the error due to the variation in reference voltage; the other is capacitor DAC correction (portion surrounded by a square denoted with (b) in FIG. 39) for obtaining the correction value for the error due to the variation in capacitance.

As illustrated in FIG. 39, first, the control circuit 5 sets i=M and j=1 (Step S101). Note that the capacitor bank 11b-1 (bank #1) corresponds to MSB and the capacitor bank 11b-M (bank #M) corresponds to LSB (Least Significant Bit).

In the sampling signal mode, the control circuit 5 has the reference voltage supplied to the bank #(i−1) as the correction target, and controls the reference voltage supplied to the bank #(i−1) for sampling (Step S102). Then, AD conversion is performed using the bank #i and the subsequent banks (banks corresponding to the bits at and below the bit corresponding to the bank #i) (Step S103). The control circuit 5 determines whether the AD conversion result is correct or not (Step S104).

When the AD conversion result is correct (Yes in Step S104), the control circuit 5 controls the correction voltage (set voltage) for the j-th bit of the bank #(i−1) for inputting to the capacitor DAC1b (Step S105) and AD conversion is performed (Step S106). Then, the correction value for the capacitor corresponding to the j-th bit of the bank #(i−1) is calculated (Step S107).

Next, the control circuit 5 determines whether j is the bit number of the bank #(i−1) or more (Step S108) and when j is the bit number of the bank #(i−1) or more (Yes in Step S108), determines whether i is 2 or less (Step S109). When i is 2 or less (Yes in Step S109), the calculation processing for the correction value ends.

When the AD conversion result is not correct in Step S104 (No in Step S104), the reference voltage is adjusted (Step S110), and the processing returns to Step S102. In Step S108, when j is not the bit number of the bank #(i−1) or more (No in Step S108), the processing returns to Step S105 assuming that j=j+1. When i is not 2 or less in Step S109 (No in Step S109), the processing returns to Step S102 assuming that i=i−1 (Step S112).

Although the correction processing is performed from the lower bit in this example, the correction processing may be performed from the higher bit as described in the fifth embodiment and the first embodiment and the processing procedure is not limited to the example of FIG. 39.

As thus described, in this embodiment, both the correction of the error due to the variation in capacitance and the correction of the error due to the variation in reference voltage are performed without provision of a special circuit for generating the correction voltage. Therefore, as compared with the case in which only one of them is corrected, the error of the AD conversion result can be reduced further. Moreover, the circuit scale can be suppressed as compared with the seventh embodiment.

NINTH EMBODIMENT

Next, an AD conversion circuit according to the ninth embodiment is described. The structure and operation of the AD converter of this embodiment are similar to those of the AD converter according to any of the first to eighth embodiments except for the following point.

In this embodiment, when the AD conversion result and the ideal code are compared for the reference voltage correction or when the AD conversion result and the ideal code are compared for calculating the correction value, the AD conversion results are averaged at least twice. The AD converter allows thermal noises from the comparator or switch. For reducing the influence of the thermal noise, a plurality of the AD conversion results is averaged, so that measurement can be performed accurately depending on the number of the AD conversion results.

TENTH EMBODIMENT

Figure 40:
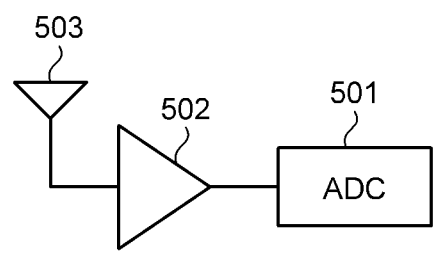
FIG. 40 illustrates a structure example of a receiver according to a tenth embodiment.

FIG. 40 illustrates a structure example of a receiver according to the tenth embodiment. The receiver of this embodiment includes an AD converter (ADC) 501 according to any of the first to ninth embodiments, an amplifier 502, and an antenna 503. The amplifier 502 amplifies a signal received with the antenna 503, and the AD converter 501 converts the amplified signal into a digital signal.

The receiver according to this embodiment can use the AD conversion results accurately by having the AD converter according to any of the first to ninth embodiments. Although a wireless receiver including the antenna 501 was described here, the AD converter of this embodiment may be used for a wired receiver. Moreover, the AD converter of this embodiment is applicable to any device other than the receiver such as an electronic appliance device which performs AD conversion and electric appliance.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An analog-digital converter comprising:
a capacitor DAC including one or more capacitor elements having a capacitance value with binary weight, and a switch configured to switch a connection destination of the capacitor element, wherein at least one of the capacitor elements is connected to an input signal and generates an output signal corresponding to a connection state of the capacitor element by switching of the switch;
a reference voltage generation circuit that supplies a reference voltage to the capacitor DAC;
a comparator that outputs a comparison result in accordance with the output signal;
a successive approximation register that outputs a digital signal in accordance with the comparison result of the comparator; and
a control circuit that controls the connection state of the capacitor element in accordance with the digital signal, wherein
the control circuit compares a conversion result, which is the digital signal obtained by sampling a predetermined voltage, and an ideal code, which is an ideal digital signal correspond to the predetermined voltage, and controls for performing correction for reducing error of the digital signal in accordance with this comparison result.

2. The analog-digital converter according to claim 1, wherein
the capacitor element connected to the input signal is connected to the reference voltage instead of the input signal, and the predetermined voltage is determined based on a difference between the reference voltage connected at the sampling and the reference voltage connected at the comparison to the capacitor element among the capacitor elements of the capacitor DAC, that remains connected to a same destination during the comparison and has a difference in the reference voltage connected at the sampling and at the comparison.

3. The analog-digital converter according to claim 1, further comprising a correction voltage generation circuit that generates a correction voltage, which is the predetermined voltage.

4. The analog-digital converter according to claim 1, wherein
the capacitor DAC includes one or more capacitor banks including one or more of the capacitor elements, and uses the reference voltage different for each of the capacitor banks,
the reference voltage generation circuit has a function of adjusting the reference voltage, and
the control circuit controls the reference voltage generation circuit for boosting or bucking the reference voltage used by the capacitor bank based on the comparison result between the conversion result and the ideal code for each capacitor bank.

5. The analog-digital converter according to claim 2, wherein
the capacitor DAC includes one or more capacitor banks including one or more of the capacitor elements, and uses the reference voltage different for each of the capacitor banks,
the reference voltage generation circuit has a function of adjusting the reference voltage, and
the control circuit controls the reference voltage generation circuit for boosting or bucking the reference voltage used by the capacitor bank based on the comparison result between the conversion result and the ideal code for each capacitor bank.

6. The analog-digital converter according to claim 1, further comprising a digital correction circuit that adds a correction value to the output signal, wherein
the capacitor DAC includes one or more capacitor banks including one or more of the capacitor elements, and uses the reference voltage different for each of the capacitor banks,
the reference voltage generation circuit generates the reference voltage so that a part of an input range of the capacitor element in the capacitor bank corresponding to a bit below a bit as a correction target overlaps, and
the control circuit obtains the correction value corresponding to the bit as the correction target based on the comparison result between the ideal code and the conversion result of the bit below the bit as the correction target and notifies the digital correction circuit of the correction value.

7. The analog-digital converter according to claim 2, further comprising a digital correction circuit that adds a correction value to the output signal, wherein
the capacitor DAC includes one or more capacitor banks including one or more of the capacitor elements, and uses the reference voltage different for each of the capacitor banks,
the reference voltage generation circuit generates the reference voltage so that a part of an input range of the capacitor element in the capacitor bank corresponding to a bit below a bit as a correction target overlaps, and
the control circuit obtains the correction value corresponding to the bit as the correction target based on the comparison result between the ideal code and the conversion result of the bit below the bit as the correction target and notifies the digital correction circuit of the correction value.

8. The analog-digital converter according to claim 1, wherein the control circuit uses a mean value of two or more of the conversion results as a comparison target with the ideal code.

9. The analog-digital converter according to claim 2, wherein the control circuit uses a mean value of two or more of the conversion results as a comparison target with the ideal code.

10. A receiver comprising:
an amplifier configured to amplify a reception signal and an analog-digital converter configured to convert the amplified reception signal into a digital signal,
the analog-digital converter comprising:
a capacitor DAC including one or more capacitor elements having a capacitance value with binary weight, and a switch configured to switch a connection destination of the capacitor element, wherein at least one of the capacitor elements is connected to an input signal and generates an output signal corresponding to a connection state of the capacitor element by switching of the switch;
a reference voltage generation circuit that supplies a reference voltage to the capacitor DAC;
a comparator that outputs a comparison result in accordance with the output signal;
a successive approximation register that outputs a digital signal in accordance with the comparison result of the comparator; and
a control circuit that controls the connection state of the capacitor element in accordance with the comparison result of the comparator, wherein
the control circuit compares a conversion result, which is the digital signal obtained by sampling a predetermined voltage, and an ideal code, which is an ideal digital signal correspond to the predetermined voltage, and controls for performing correction for reducing error of the digital signal in accordance with this comparison result.

11. The receiver according to claim 10, wherein
the capacitor element connected to the input signal is connected to the reference voltage instead of the input signal, and
the predetermined voltage is determined based on a difference between the reference voltage connected at the sampling and the reference voltage connected at the comparison to the capacitor element among the capacitor elements of the capacitor DAC, that remains connected to a same destination during the comparison and has a difference in the reference voltage connected at the sampling and at the comparison.

12. The receiver according to claim 10, wherein
the capacitor DAC includes one or more capacitor banks including one or more of the capacitor elements, and uses the reference voltage different for each of the capacitor banks,
the reference voltage generation circuit has a function of adjusting the reference voltage, and
the control circuit controls the reference voltage generation circuit for boosting or bucking the reference voltage used by the capacitor bank based on the comparison result between the conversion result and the ideal code for each capacitor bank.

13. The receiver according to claim 10, further comprising a digital correction circuit that adds a correction value to the output signal, wherein the capacitor DAC includes one or more capacitor banks including one or more of the capacitor elements, and uses the reference voltage different for each of the capacitor banks, the voltage generation circuit generates the reference voltage so that a part of an input range of the capacitor element in the capacitor bank corresponding to a bit below a bit a bit as a correction target overlaps, and the control circuit obtains the correction value of the capacitor element corresponding to the bit as the correction target based on the comparison result between the ideal code and the conversion result of the bit below the bit as the correction target and notifies the digital correction circuit of the correction value.

14. The receiver according to claim 10, wherein the control circuit uses a mean value of two or more of the conversion results as a comparison target with the ideal code.

* * * * *